US012753506B2

(12) United States Patent
Cho et al.

(10) Patent No.: US 12,753,506 B2
(45) Date of Patent: Oct. 6, 2026

(54) SUBSTRATE PROCESSING DEVICE AND METHOD FOR CLEANING SUBSTRATE PROCESSING DEVICE

(71) Applicant: JUSUNG ENGINEERING CO., LTD., Gwangju-Si (KR)

(72) Inventors: Won Tae Cho, Gwangju-Si (KR); Yo Han Bang, Gwangju-Si (KR); Tae Yang Jang, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 380 days.

(21) Appl. No.: 18/569,204

(22) PCT Filed: Jun. 10, 2022

(86) PCT No.: PCT/KR2022/008223

§ 371 (c)(1),
(2) Date: Dec. 11, 2023

(87) PCT Pub. No.: WO2022/260474

PCT Pub. Date: Dec. 15, 2022

(65) Prior Publication Data

US 2025/0027200 A1 Jan. 23, 2025

(30) Foreign Application Priority Data

Jun. 11, 2021 (KR) ........................ 10-2021-0076039

(51) Int. Cl.
*C23C 16/455* (2006.01)
*C23C 16/44* (2006.01)
(Continued)

(52) U.S. Cl.
CPC .... *C23C 16/45587* (2013.01); *C23C 16/4405* (2013.01); *C23C 16/458* (2013.01);
(Continued)

(58) Field of Classification Search
CPC .......... C23C 16/45587; C23C 16/4405; C23C 16/458; C23C 16/4585; H01J 37/3244;
(Continued)

(56) References Cited

U.S. PATENT DOCUMENTS

2014/0109940 A1* 4/2014 Ohashi .............. H01J 37/32862 134/37

FOREIGN PATENT DOCUMENTS

CN 217114307 U 8/2022
JP 2000223429 A 8/2000
(Continued)

OTHER PUBLICATIONS

Written Opinion for PCT/KR2022/008223, mailed Sep. 28, 2022.
International Search Report for PCT/KR2022/008223, mailed Sep. 28, 2022.

*Primary Examiner* — Rodney G Mcdonald
(74) *Attorney, Agent, or Firm* — Renaissance IP Law Group LLP

(57) ABSTRACT

A substrate processing apparatus includes a chamber, a substrate support positioned inside the chamber and supporting a substrate, an edge frame disposed above the substrate support and extending outward from an edge of the substrate support, and a gas flow-controlling unit installed on a side wall of the chamber to be positioned between the side wall of the chamber and a side surface of the substrate support along a periphery of the substrate support. The gas flow-controlling unit includes a flow path provided in a region overlapping the edge frame. Thus, the gas may be prevented from flowing unevenly to the corners or regions other than the corners within the chamber. That is, the gas may be evenly distributed in the circumferential direction of the chamber. Accordingly, the cleaning defect may be pre-
(Continued)

vented from occurring at the corners of the chamber and in regions other than the corners.

10 Claims, 10 Drawing Sheets

(51) Int. Cl.
*C23C 16/458* (2006.01)
*H01J 37/32* (2006.01)
*H10P 72/00* (2026.01)

(52) U.S. Cl.
CPC .... *H01J 37/3244* (2013.01); *H01J 37/32449* (2013.01); *H01J 37/32623* (2013.01); *H01J 37/32642* (2013.01); *H01J 37/32715* (2013.01); *H10P 72/00* (2026.01)

(58) Field of Classification Search
CPC ........... H01J 37/32449; H01J 37/32623; H01J 37/32642; H01J 37/32715; H10P 72/00
USPC ........................................... 118/728; 134/1.1
See application file for complete search history.

(56) References Cited

FOREIGN PATENT DOCUMENTS

| | | | |
|---|---|---|---|
| KR | 100794661 | B1 | 1/2008 |
| KR | 20120077546 | A | 7/2012 |
| KR | 200487917 | Y1 | 11/2018 |
| KR | 20190096778 | A | 8/2019 |
| WO | 2021061123 | A1 | 4/2021 |

* cited by examiner

1000 : 1100, 1200

SUBSTRATE PROCESSING DEVICE AND METHOD FOR CLEANING SUBSTRATE PROCESSING DEVICE

TECHNICAL FIELD

The present disclosure relates to a substrate processing apparatus and a method for cleaning the substrate processing apparatus, and more particularly, to a substrate processing apparatus capable of allowing a gas to be evenly distributed and flow inside the chamber and a method for cleaning the substrate processing apparatus.

BACKGROUND ART

When processes of depositing thin films on substrates are performed inside chambers, thin films or by-products adhere to inner walls of the chambers, which act as impurities that contaminate substrates during the subsequent deposition processes.

Thus, after the deposition processes are performed a plurality of times or a certain number of times, cleaning gases are sprayed to clean the inside of the chambers. However, when such a cleaning gas diffuses or moves inside a chamber, the amount of the gas moving toward a corner becomes relatively small, or the amount of the gas moving toward a region other than the corner is relatively small. Accordingly, a cleaning defect, in which impurities remain in the corner of the chamber or in a region other than the corner, occurs.

RELATED ART DOCUMENT

Related Art Document

Patent Document (patent document 1) Korean Patent Registration No. KR0794661

DISCLOSURE OF THE INVENTIVE CONCEPT

Technical Problem

The present disclosure provides a substrate processing apparatus capable of allowing a gas to be evenly distributed and flow and a method for cleaning the substrate processing apparatus.

The present disclosure also provides a substrate processing apparatus capable of preventing a cleaning defect and a method for cleaning the substrate processing apparatus.

Technical Solution

In accordance with an exemplary embodiment, a substrate processing apparatus includes: a chamber; a substrate support positioned inside the chamber and configured to support a substrate; an edge frame disposed above the substrate support and extending outward from an edge of the substrate support; and a gas flow-controlling unit which is installed on a side wall of the chamber to be positioned between the side wall of the chamber and a side surface of the substrate support along a periphery of the substrate support, wherein the gas flow-controlling unit includes a flow path which is provided in a region overlapping the edge frame.

The gas flow-controlling unit may include: a body connected to the side wall; and a protrusion member protruding upward from the body to face the edge frame, wherein the flow path is provided in the body to face the edge frame.

The protrusion member may be provided at an edge of the body to be positioned on the opposite side from the side wall.

The protrusion member may be provided in plurality, the plurality of protrusion members may be arranged in a width direction of the side wall and spaced apart from each other, and the flow path may be a space between the plurality of protrusion members.

The protrusion member may extend in a width direction of the side wall, and the flow path may be provided behind the protrusion member to face the edge frame and pass through the body in an up-down direction.

The flow path may extend in the width direction of the side wall.

The flow path may be provided in plurality, and the plurality of flow paths may be arranged in an extension direction of the protrusion member and spaced apart from each other.

The gas flow-controlling unit may be installed in a central region other than an edge of the side wall in the width direction.

In accordance with another exemplary embodiment, a method is for cleaning a substrate processing apparatus that includes: a chamber; a substrate support positioned inside the chamber and configured to support a substrate; an edge frame disposed above the substrate support and extending outward from an edge of the substrate support; and a gas flow-controlling unit installed on a side wall of the chamber to support the edge frame from below. The method includes: lowering the substrate support to rest the edge frame on the gas flow-controlling unit; spraying a cleaning gas into the chamber; and allowing the cleaning gas to pass through a flow path which is provided in the gas flow-controlling unit to be positioned in a region that overlaps the edge frame.

In accordance with yet another exemplary embodiment, a method is for cleaning a substrate processing apparatus that includes: a chamber; a gas spraying unit installed in the chamber; a substrate support installed inside the chamber to support a substrate at a position facing the gas spraying unit; an edge frame extending outward from an edge of the substrate support; and a gas flow-controlling unit which is installed on a side wall of the chamber to be positioned between the side wall of the chamber and a side surface of the substrate support along a periphery of the substrate support. The method includes: withdrawing, out of the chamber, the substrate supported on the substrate support; spraying a cleaning gas into the chamber by using the gas spraying unit; and allowing the cleaning gas to be discharged through a flow path which is provided in the gas flow-controlling unit to be positioned in a region that overlaps the edge frame.

Advantageous Effects

According to the embodiments of the present disclosure, it is possible to prevent the gas from flowing unevenly to the corners or regions other than the corners within the chamber. That is, it is possible to evenly distribute the gas in the circumferential direction of the chamber. Accordingly, it is possible to prevent the cleaning defect from occurring at the corners of the chamber and in regions other than the corners.

MODE FOR CARRYING OUT THE INVENTIVE CONCEPT

Figure 1:
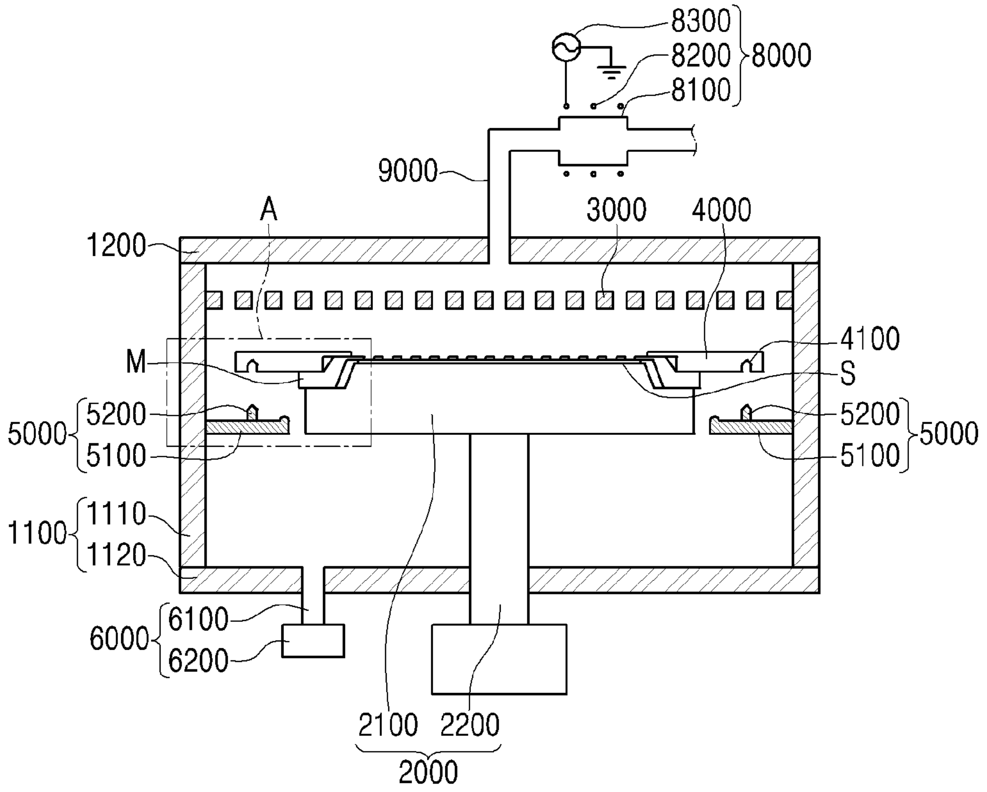
FIGS. 1 and 2 are views schematically showing a substrate processing apparatus according to an embodiment of the present disclosure.

Hereinafter, embodiments of the present disclosure will be described in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. In the drawings, the dimensions are exaggerated for clarity of illustration, and like reference numerals refer to like elements throughout.

Figure 2:
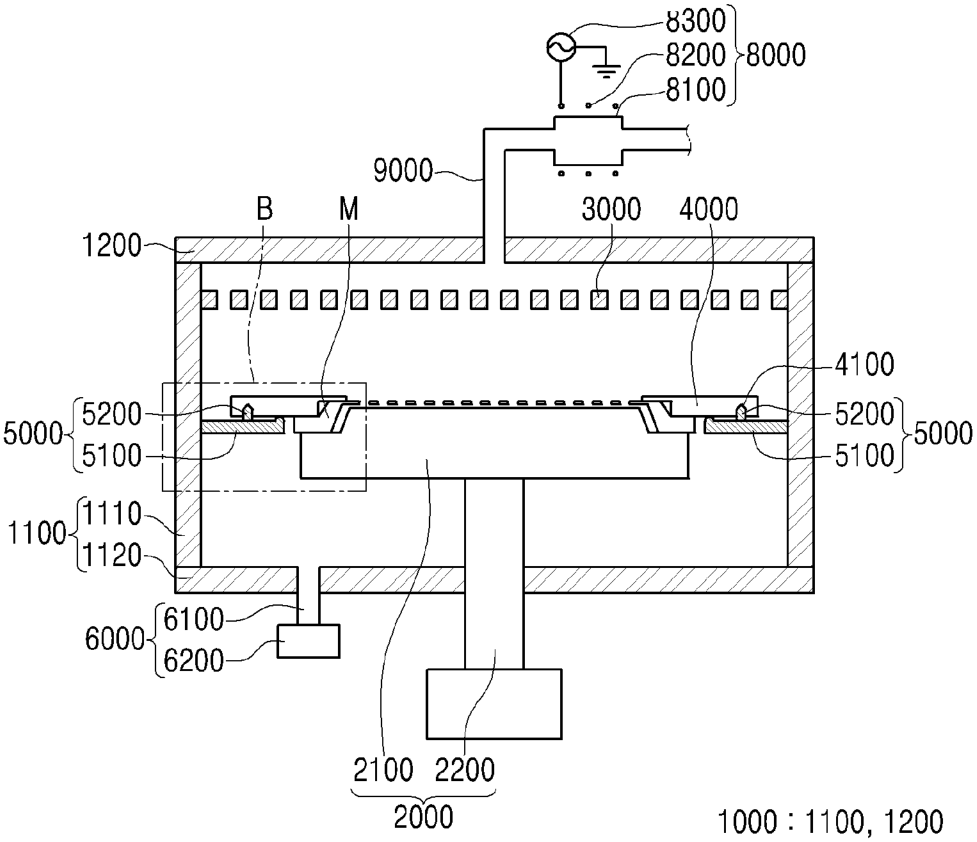
Figure 3:
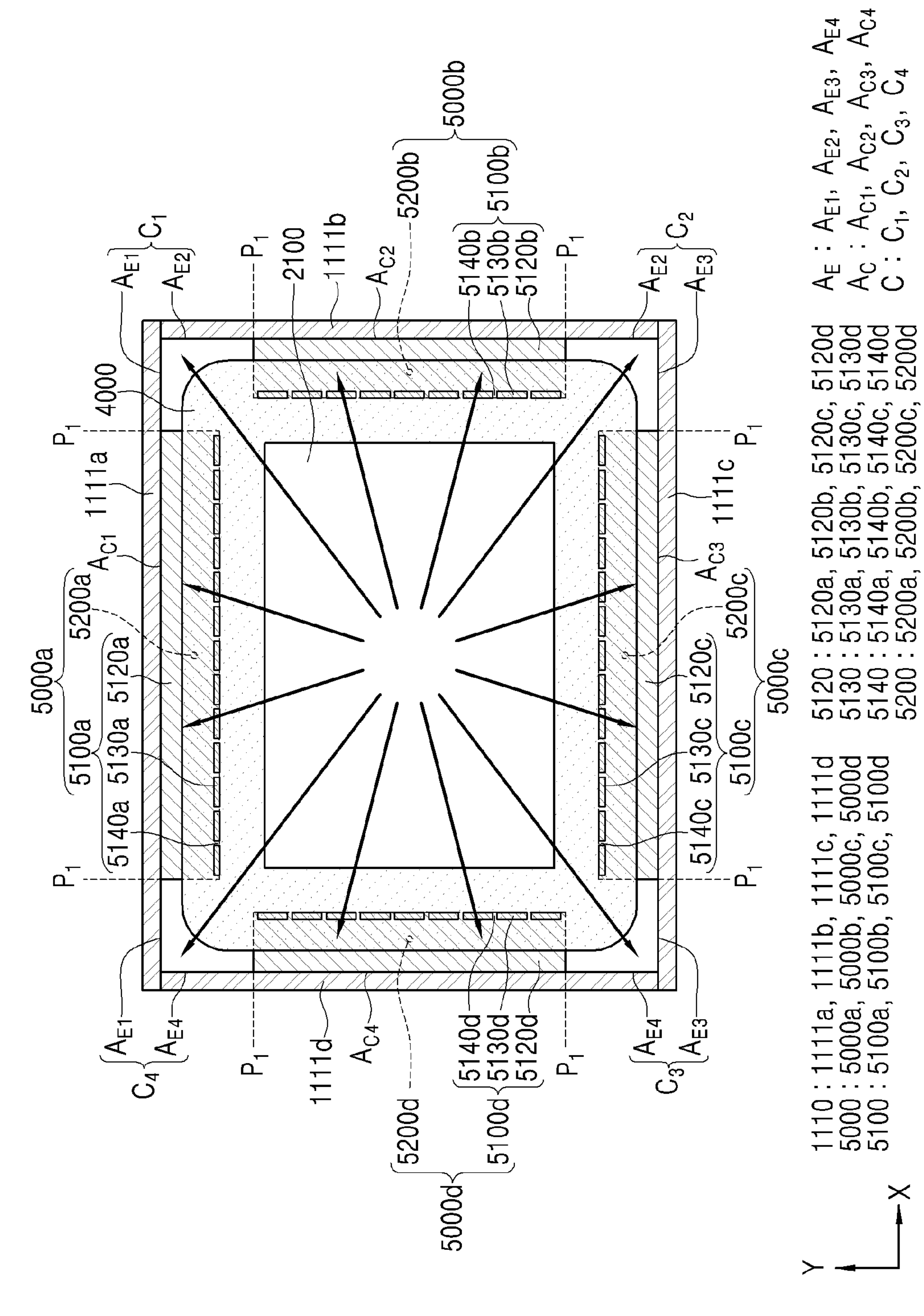
FIG. 3 is a plan view when the substrate processing apparatus according to the embodiment of the present disclosure is viewed from above an edge frame.
Figure 4:
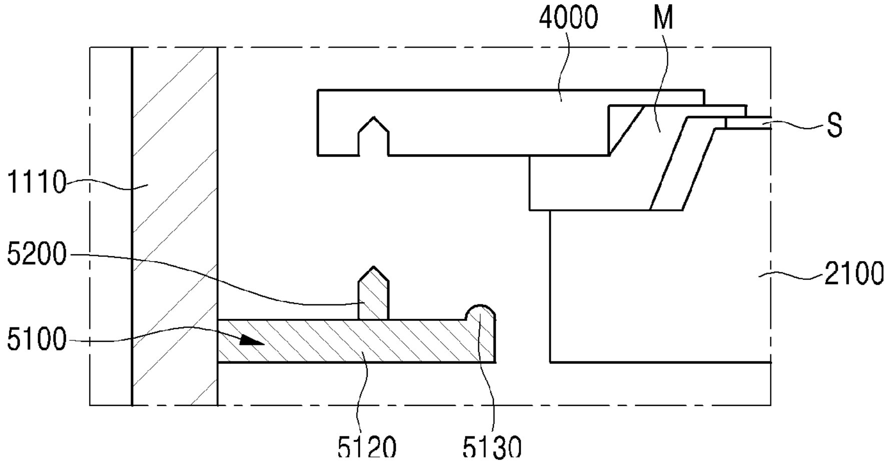
FIG. 4 is an enlarged view illustrating 'A' of FIG. 1.

FIGS. 1 and 2 are views schematically showing a substrate processing apparatus according to an embodiment of the present disclosure. FIG. 3 is a plan view when the substrate processing apparatus according to the embodiment of the present disclosure is viewed from above an edge frame. FIG. 4 is an enlarged view illustrating 'A' of FIG. 1, and FIG. 5 is an enlarged view illustrating 'B' of FIG. 2.

Figure 5:
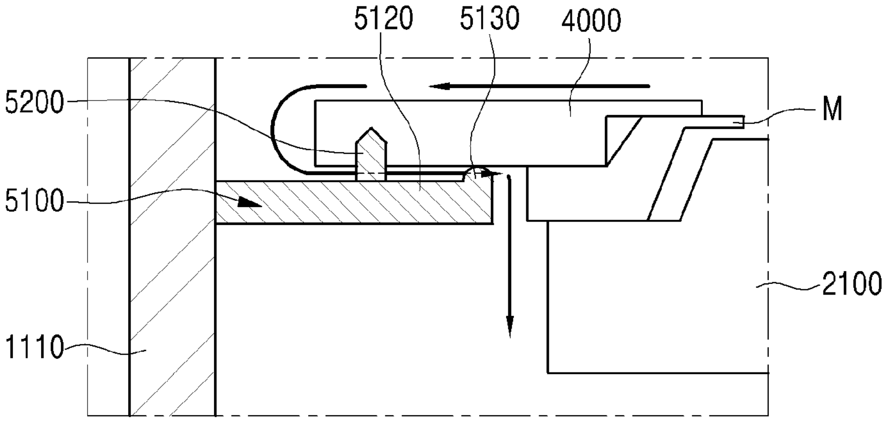
FIG. 5 is an enlarged view illustrating 'B' of FIG. 2.

Here, FIGS. 1 and 4 are views illustrating a state in which an edge frame is spaced upward from a gas flow-controlling unit, and FIGS. 2 and 5 are views illustrating a state in which the edge frame rests on the gas flow-controlling unit.

Also, FIGS. 1 and 4 show an example in a state in which a substrate support and an edge frame are raised so as to perform a substrate processing process, such as a deposition process inside a chamber, and FIGS. 2 and 5 show an example in a state in which the substrate support and the edge frame are lowered so as to clean the inside of the chamber.

Also, for convenience of description, FIG. 3 illustrates a state in which a substrate and a mask are not supported above the substrate support.

Referring to FIGS. 1 to 3, a substrate processing apparatus according to an embodiment may include: a chamber 1000 having an inner space in which a substrate S may be processed; a support unit 2000 provided with a substrate support 2100 that supports the substrate S loaded into the chamber 1000; a spray unit 3000 which is installed inside the chamber 1000 to face the substrate support 2100 and sprays a gas; an edge frame 4000 which is installed above the substrate support 2100 to extend outward from an edge of the substrate support 2100; a gas flow-controlling unit 5000 (5000*a*, 5000*b*, 5000*c*, 5000*d*) which is installed in a region other than a corner C on a side wall section 1110 of the chamber 1000 so as to be positioned below the edge frame 4000 and which is provided with a flow path 5140 (5140*a*, 5140*b*, 5140*c*, 5140*d*) through which the gas may pass; and an exhaust unit 6000 which is connected to the chamber 1000 to discharge gases and by-products inside the chamber 1000.

Also, the substrate processing apparatus may include a plasma generator 8000 positioned outside the chamber 1000 to generate plasma and a supply pipe 9000 installed to connect the plasma generator 8000 to the spray unit 3000.

Also, the substrate processing apparatus may further include a mask M mounted to a lower portion of the edge frame 4000.

The chamber 1000 may have an inner space in which the substrate S may be processed, and the inner space is airtightly sealed. The chamber 1000 may be provided with, for example, a main body 1100 having the inner space and a cover 1200 for covering an opening on an upper side of the main body 1100.

Hereinafter, the chamber 1000 will be described in more detail. Here, the chamber 1000 having an inner space with a quadrangular cross-section will be described as an example.

The cover 1200 may have a quadrangular shape with four edges or sides. The cover 1200 is configured to cover the opening on the upper side of the main body 1100 as described above and thus may be referred to as an upper wall section of the chamber 1000.

The main body 1100 may include a lower wall section 1120, which is disposed below the cover 1200 to face the same and has a quadrangular shape with four edges or sides, and a side wall section 1110, which extends upward from the lower wall section 1120 so as to surround the four edges of the lower wall section 1120.

The side wall section 1110 is located between the cover 1200 and the lower wall section 1120, which are vertically spaced apart from each other, and extends in the circumferential direction of the cover 1200 and the lower wall section 1120. That is, the side wall section 1110 may have a hollow or tubular shape having the inner space and the open upper and lower sides. The lower wall section 1120 is installed to cover the opening on the lower side of the side wall section 1110, and the cover 1200 is installed to cover the opening on the upper side of the side wall section 1110.

The side wall section 1110 extends in the circumferential direction of the cover 1200 and the lower wall section 1120 which have a quadrangular shape. To this end, the side wall section 1110 may include four side walls (hereinafter, referred to as first to fourth side walls 1111*a*, 1111*b*, 1111*c*, and 1111*d*) as illustrated in FIG. 3. Also, the first side wall 1111*a*, the second side wall 1111*b*, the third side wall 1111*c*, and the fourth side wall 1111*d* are arranged clockwise in this order, and thus these side walls connected to each other may form a quadrangular hollow shape. In more detail, the first and third side walls 1111*a* and 1111*c* extend in a first direction (an X-axis direction) and are spaced apart from each other in a second direction (an Y-axis direction). The second and fourth side walls 1111*b* and 1111*d* extend in the second direction (the Y-axis direction) and are spaced apart from each other in the first direction (the X-axis direction). Here, the lengths of the first side wall 1111*a* and the third side wall 1111*c* in the first direction are equal to each other, and the lengths of the second side wall 1111*b* and the fourth side wall 1111$d$ in the second direction are equal to each other. The lengths of the first and third side walls 1111$a$ and 1111$c$ in the first direction may be greater than the lengths of the second and fourth side walls 1111$b$ and 1111$d$ in the second direction. Also, the second side wall 1111$b$ is connected to one end of each of the first and third side walls 1111$a$ and 1111$c$ to form a connection therebetween, and the fourth side wall 1111$d$ is connected to the other end of each of the first and third side walls 1111$a$ and 1111$c$ to form a connection therebetween.

Accordingly, the side wall section 1110 including the first to fourth side walls 1111$a$ to 1111$d$ may have a hollow shape with the rectangular inner space as illustrated in FIG. 3. Also, the extension lengths of the first and third side walls 1111$a$ and 1111$c$ are greater than those of the second and fourth side walls 1111$b$ and 1111$d$. Thus, the first and third side walls 1111$a$ and 1111$c$ may be referred to as long side walls, and the second and fourth side walls 1111$b$ and 1111$d$ may be referred to as short side walls. Also, the first to fourth side walls 1111$a$ to 1111$d$ are walls for constituting the chamber 1000 and thus may be referred to as first to fourth walls.

As described above, the first to fourth side walls 1111$a$ to 1111$d$ are connected to each other to form the side wall section 1110, and thus, the side wall section 1110 may have a corner C ($C_1$, $C_2$, $C_3$, $C_4$) formed by two neighboring side walls. That is, the side wall section 1110 has a connection portion, in which the two neighboring side walls are connected to each other, and the corner C ($C_1$, $C_2$, $C_3$, $C_4$), which is a region from the connection portion to points spaced a certain distance therefrom in both directions. In other words, the side wall section 1110 has the corner C ($C_1$, $C_2$, $C_3$, $C_4$), which corresponds to the edge of two neighboring side walls. Here, referring to FIG. 3, the edge of each of the side walls 1111$a$ to 1111$d$ may represent regions to first points $P_1$ which are spaced a first distance from both ends of the side walls 1111$a$ to 1111$d$. Also, regions except for both the edges $A_E$ ($A_{E1}$, $A_{E2}$, $A_{E3}$, $A_{E4}$) in the side walls 1111$a$ to 1111$d$ or regions between both the edges $A_E$ ($A_{E1}$, $A_{E2}$, $A_{E3}$, $A_{E4}$) may be referred to as a central region $A_C$ ($A_{C1}$, $A_{C2}$, $A_{C3}$, $A_{C4}$). Here, the extension length of the central region $A_C$ is about 80% to about 95% of the overall length of each of the side walls 1111$a$ to 1111$d$, and the remainder may be the length of the region of both the edges $A_E$ ($A_{E1}$, $A_{E2}$, $A_{E3}$, $A_{E4}$).

When explaining the above with a more specific example, in the case where the side wall section 1110 includes the first to fourth side walls 1111$a$ to 1111$d$, and the first side wall 1111$a$, the second side wall 1111$b$, the third side wall 1111$c$, and the fourth side wall 1111$d$ are arranged clockwise in this order and connected to each other as described above, the side wall section 1110 includes the four corners $C_1$, $C_2$, $C_3$, and $C_4$. That is, the side wall section 1110 may include the first corner $C_1$ formed by the first side wall 1111$a$ and the second side wall 1111$b$, the second corner $C_2$ formed by the second side wall 1111$b$ and the third side wall 1111$c$, the third corner $C_3$ formed by the third side wall 1111$c$ and the fourth side wall 1111$d$, and the fourth corner $C_4$ formed by the fourth side wall 1111$d$ and the first side wall 1111$a$.

More specifically, the side wall section 1110 may include the first corner $C_1$ that includes a first connection portion between the first side wall 1111$a$ and the second side wall 1111$b$ and an edge $A_{E1}$ of the first side wall 1111$a$ and an edge $A_{E2}$ of the second side wall 1111$b$ with the first connection portion therebetween, the second corner $C_2$ that includes a second connection portion between the second side wall 1111$b$ and the third side wall 1111$c$ and the edge $A_{E2}$ of the second side wall 1111$b$ and an edge $A_{E3}$ of the third side wall 1111$c$ with the second connection portion therebetween, the third corner $C_3$ that includes a third connection portion between the third side wall 1111$c$ and the fourth side wall 1111$d$ and the edge $A_{E3}$ of the third side wall 1111$c$ and an edge $A_{E4}$ of the fourth side wall 1111$d$ with the third connection portion therebetween, and the fourth corner $C_4$ that includes a fourth connection portion between the fourth side wall 1111$d$ and the first side wall 1111$a$ and an edge $A_{E4}$ of the fourth side wall 1111$d$ and the edge $A_{E1}$ of the first side wall 1111$a$ with the fourth connection portion therebetween.

As described above, the chamber 1000 has a quadrangular cross-section, and the side wall section 1110 includes the first to fourth side walls 1111$a$ to 1111$d$ and has the four corners $C_1$ to $C_4$. However, the embodiment is not limited thereto, and the chamber 1000 may have cross-sections with various shapes such as polygons. Also, the side wall section 1110 may include less than four or more than four side walls and thus may be provided with less than four or more than four corners C.

The exhaust unit 6000 is to discharge gases present inside the chamber 1000, and may be connected to the chamber 1000 so as to be positioned below the substrate support 2100. More specifically, the exhaust unit 6000 may be connected to the lower wall section 1120 of the chamber 1000, so as to be positioned below the substrate support 2100 and communicate with the inner space of the chamber 1000. Also, the exhaust unit 6000 may include an exhaust pipe 6100 connected to the chamber 1000 and a pump 6200 connected to the exhaust pipe 6100 outside the chamber 1000. The exhaust unit 6000 may discharge gases and by-products inside the chamber 1000 to the outside by operation of the pump 6200, and accordingly, the pressure inside the chamber 1000 may be regulated.

Also, the gases and by-products inside the chamber 1000 are moved toward the exhaust unit 6000 and discharged to the outside by the suction force or pumping force from the exhaust unit 6000, and thus, the movement flow of the gases and by-products is formed by the operation of the exhaust unit 6000.

The support unit 2000 may include a substrate support 2100, on which a substrate S rests, and an actuator 2200, which is disposed below the substrate support 2100 and raises and lowers the substrate support 2100.

The substrate support 2100 may installed below the spray unit 3000 so as to face the spray unit 3000. The substrate support 2100 may be manufactured to be larger than the substrate S, and may have a shape corresponding to that of the substrate S, for example, a quadrangular shape. Also, a heater may be installed inside the substrate support 2100, and the heater may generate heat at a certain temperature and heat the substrate support 2100 and the substrate S.

The actuator 2200 may be installed to support at least one region of the substrate support 2100, for example, the central portion thereof. In addition, by the operation of the actuator 2200, the substrate support 2100 may be raised to be close to the spray unit 3000 as illustrated in FIG. 1, or may be lowered to move away from the spray unit 3000 as illustrated in FIG. 2.

When lowered to move away from the spray unit 3000 by the operation of the actuator 2200, the substrate support 2100 may be lowered so that the edge frame 4000 installed on the substrate support 2100 rests on the gas flow-controlling unit 5000. Also, when the substrate support 2100 is further lowered by operating the actuator 2200 in a state in which the edge frame 4000 rests on the gas flow-controlling unit 5000, the substrate support 2100 may be separated from the edge frame 4000. That is, the edge frame 4000, to which the mask M is mounted, may be separated from the substrate support 2100.

The spray unit 3000 is installed inside the chamber 1000 so as to face the substrate support 2100 and sprays a gas toward the substrate support 2100. The spray unit 3000 may be installed to be spaced downward from the cover 1200, that is, the upper wall section inside the chamber 1000. Accordingly, a certain space is provided between the cover 1200 of the chamber 1000 and the spray unit 3000, and the space may serve to allow the gas, which flows in from the supply pipe 9000, to be diffused in the chamber 1000. Here, the cover 1200 spaced upward from the spray unit 3000 may serve as a backing plate.

The spray unit 3000 may be made, for example, in the form of a showerhead in which a plurality of flow paths for ejecting or spraying gases are provided. Also, the spray unit 3000 may have a shape corresponding to that of the substrate S, for example, an approximately quadrangular shape.

The plasma generator 8000 receives a gas and activates the gas, and then supplies the activated gas into the chamber 1000 via the supply pipe 9000. The plasma generator 8000 may include a container 8100 installed to be connected to the supply pipe 9000 outside the chamber 1000, an antenna 8200 installed to surround the outside of the container 8100, and a power source 8300 connected to one end of the antenna 8200 to apply RF power. The plasma generator 8000 activates the gas inside the container 8100 surrounded by the antenna 8200 and generates plasma.

The gas supplied into the container 8100 may be a gas for processing the substrate S, that is, a gas for depositing a thin film on the substrate S or etching the substrate S or a thin film. Also, the gas supplied into the container 8100 may be a gas for cleaning the inside of the chamber 1000. Here, the gas for cleaning the chamber 1000 may include, for example, $NF_3$.

The plasma generator 8000 may be a remote plasma generator that activates the gas outside the chamber 1000, generates the plasma, and then supplies the plasma into the chamber 1000 as described above.

The edge frame 4000 has a shape, which extends from the edge of the substrate support 2100 in the width direction to the outside of the substrate support 2100 so as to expose a substrate region to be processed, and is disposed above the substrate support 2100. That is, the edge frame 4000 may have a hollow shape that covers the edge of the upper surface of the substrate support 2100, on which the substrate S rests, and exposes the remainder of the upper surface as illustrated in FIG. 3. Here, the width direction of the substrate support 2100 may represent both the first direction (the X-axis direction) and the second direction (the Y-axis direction).

The edge frame 4000 may extend from the edge of the substrate support 2100 toward the side wall section 1110 of the chamber 1000. Accordingly, a portion of the lower surface of the edge frame 4000 faces the substrate support 2100, and the remainder of the lower surface is located outside the substrate support 2100. That is, a portion of the edge frame 4000 overlaps the position of the substrate support 2100 in the width direction, and the remainder thereof is located outside the substrate support 2100 in the width direction.

When the edge frame 4000 extends from the edge of the substrate support 2100 toward the side wall section 1110 of the chamber 1000, the end thereof facing the side wall section 1110 extends to be located outside the side surface of the substrate support 2100. That is, the edge frame 4000 is provided such that the end thereof is out of the side surface of the substrate support 2100. Accordingly, with respect to the width direction, the end of the edge frame 4000 further protrudes toward the side wall section 1110 than the side surface of the substrate support 2100. Therefore, the distance between the side wall section 1110 of the chamber 1000 and the end of the edge frame 4000 is less than the distance between the side wall section 1110 of the chamber 1000 and the side surface of the substrate support 2100. In other words, the gaps between the side walls 1111*a*, 1111*b*, 1111*c*, and 1111*d* of the chamber 1000 and the side surfaces of the edge frame 4000 is less than the gaps between the side walls 1111*a*, 1111*b*, 1111*c*, and 1111*d* of the chamber 1000 and the side surfaces of the substrate support 2100.

The edge frame 4000 may be provided with grooves 4100 into which insertion members 5200 of the gas flow-controlling unit 5000 (5000*a* to 5000*d*) may be inserted, which will be described later. Each of the grooves 4100 may have a shape recessed from the lower surface of the edge frame 4000 toward the opposite side. Also, the length of the groove 4100 in the up-down direction may be less than or equal to the length of each of the insertion members 5200. When the edge frame 4000 is mounted on the gas flow-controlling unit 5000 by lowering the substrate support 2100, the groove 4100 allows the edge frame 4000 to stably rest thereon without misalignment.

The mask M is to selectively process the substrate S, and for example, may allow deposition to be selectively performed on the substrate S. The mask M may have a shape with a plurality of openings. Also, the mask M is positioned on the lower side of the edge frame 4000 and may be mounted to the lower portion of the edge frame 4000. That is, the mask M may be mounted to the lower portion of the edge frame 4000 so as to move together with the edge frame 4000.

Meanwhile, when substrate processing processes are performed a plurality of times or a certain number of times inside the chamber 1000, the inside of the chamber 1000 is cleaned. That is, cleaning is performed to remove thin films or by-products which are deposited or adhered to the inner walls of the chamber 1000, the substrate support 2100, and the like. Hereinafter, for convenience of description, the thin films or by-products, which are deposited or adhered to the inner walls of the chamber 1000, the substrate support 2100, and the like and need to be removed, are commonly referred to as 'impurities'.

In order to clean the inside of the chamber 1000, a cleaning gas, for example, a gas containing $NF_3$ is supplied to the container 8100 of the plasma generator 8000 first, and then RF power is applied thereto by using the antenna 8200. Accordingly, the cleaning gas is activated inside the container 8100 to generate plasma, and the activated cleaning gas is supplied to a space between the cover 1200 of the chamber 1000 and the spray unit 3000 via the supply pipe 9000. Then, the cleaning gas is sprayed downward by the spray unit 3000. When the cleaning gas is sprayed into the chamber 1000 as described above, impurities, such as thin films or by-products, react with the cleaning gas and are separated from the inner walls of the chamber 1000, the substrate support 2100, and the like. Subsequently, the impurities are discharged via the exhaust unit 6000. Through the above process, the inside of the chamber 1000 is cleaned.

However, when the cleaning is performed by spraying the cleaning gas into the chamber 1000 via the spray unit 3000 as described above, a corner C or a region between corners C may not be properly cleaned. In more detail, a cleaning defect, in which some impurities are not removed, may occur at the corner C at which two neighboring side walls are connected. In much more detail, the cleaning defect, in which some impurities are not removed, may occur at the first corner $C_1$ formed by the first side wall 1111*a* and the second side wall 1111*b*, the second corner $C_2$ formed by the second side wall 1111*b* and the third side wall 1111*c*, the third corner $C_3$ formed by the third side wall 1111*c* and the fourth side wall 1111*d*, and the fourth corner $C_4$ formed by the fourth side wall 1111*d* and the first side wall 1111*a*. In other words, in each of the first to fourth side walls 1111*a* to 1111*d*, cleaning defects may occur at both edges $A_{E1}$, $A_{E2}$, $A_{E3}$, and $A_{E4}$ because both the edges are insufficiently cleaned compared to the central regions $A_{C1}$, $A_{C2}$, $A_{C3}$, and $A_{C4}$.

In the case where the gas sprayed from the spray unit 3000 moves or diffuses toward the side wall section 1110, the above defect may occur when the amount of the cleaning gas directed toward the corners $C_1$ to $C_4$ is small or insufficient. That is, when the amount of the gas moving toward the edges $A_{E1}$, $A_{E2}$, $A_{E3}$, and $A_{E4}$ of the side walls 1111*a* to 1111*d* is absolutely small or relatively smaller than the amount of the gas moving toward the central regions $A_{C1}$, $A_{C2}$, $A_{C3}$, and $A_{C4}$, the above defect may occur. Thus, impurities attached to the corners $C_1$ to $C_4$ of the side wall section 1110 or the edges $A_{E1}$, $A_{E2}$, $A_{E3}$, and $A_{E4}$ of the side walls 1111*a* to 1111*d* are not completely removed but remain, and thus, the cleaning defect may occur.

Also, in another example, a cleaning defect, in which some impurities are not removed, may occur in a region other than the corner C, that is, the central region $A_C$ ($A_{C1}$, $A_{C2}$, $A_{C3}$, $A_{C4}$) which is a region between both the edges $A_{C1}$, $A_{C2}$, $A_{C3}$, and $A_{C4}$ in the side walls 1111*a* to 1111*d*. That is, the cleaning defect, in which some impurities are not removed, may occur in a first central region $A_{C1}$ of the first side wall 1111*a* that is a region between the first corner $C_1$ and the fourth corner $C_4$, a second central region $A_{C2}$ of the second side wall 1111*b* that is a region between the first corner $C_1$ and the second corner $C_2$, a third central region $A_{C3}$ of the third side wall 1111*c* that is a region between the second corner $C_2$ and the third corner $C_3$, and a fourth central region $A_{C4}$ of the fourth side wall 1111*d* that is a region between the third corner $C_3$ and the fourth corner $C_4$. In other words, in each of the first to fourth side walls 1111*a* to 1111*d*, cleaning defects may occur in the central regions $A_{C1}$, $A_{C2}$, $A_{C3}$, and $A_{C4}$ because the central regions are insufficiently cleaned compared to both edges $A_{E1}$, $A_{E2}$, $A_{E3}$, and $A_{E4}$.

In the case where the gas sprayed from the spray unit 3000 moves or diffuses toward the side wall section 1110, the cleaning defect may occur when the amount of the cleaning gas directed toward regions other than the corners $C_1$ to $C_4$ of the side wall section 1110 is small or insufficient. That is, when the amount of the gas moving toward the central regions $A_{C1}$, $A_{C2}$, $A_{C3}$, and $A_{C4}$ of the side walls 1111*a* to 1111*d* is absolutely small or relatively smaller than the amount of the gas moving toward the edges $A_{E1}$, $A_{E2}$, $A_{E3}$, and $A_{E4}$, the above defect may occur. Thus, impurities attached to the central regions $A_{C1}$, $A_{C2}$, $A_{C3}$, and $A_{C4}$ of the side wall section 1110 are not completely removed but remain, and thus, the cleaning defect may occur.

Thus, the gas flow-controlling unit 5000 (5000*a* to 5000*d*) is provided to induce the flow of the gas sprayed into the chamber 1000 via the spray unit 3000 so that the gas is distributed and moved to the corners $C_1$ to $C_4$ of the side wall section 1110 and regions other than the corners $C_1$ to $C_4$. That is, the gas flow-controlling unit 5000 is provided to reduce a difference between the amount of the gas moving toward the corners $C_1$ to $C_4$ of the side wall section 1110 and the amount of the gas moving toward regions other than the corners $C_1$ to $C_4$, thereby making it possible to evenly or uniformly distribute the gas in the circumferential direction of the side wall section 1110. In other words, the gas flow-controlling unit 5000 is provided, which allows the gas sprayed into the chamber 1000, for example, the cleaning gas to be evenly distributed and moved toward the corners $C_1$, $C_2$, $C_3$, and $C_4$ of the side wall section 1110 and the central regions $A_{C1}$, $A_{C2}$, $A_{C3}$, and $A_{C4}$ of the side walls 1111*a* to 1111*d*.

Hereinafter, a gas flow-controlling unit according to the embodiment will be described with reference to FIGS. 1 to 7.

Figure 6:
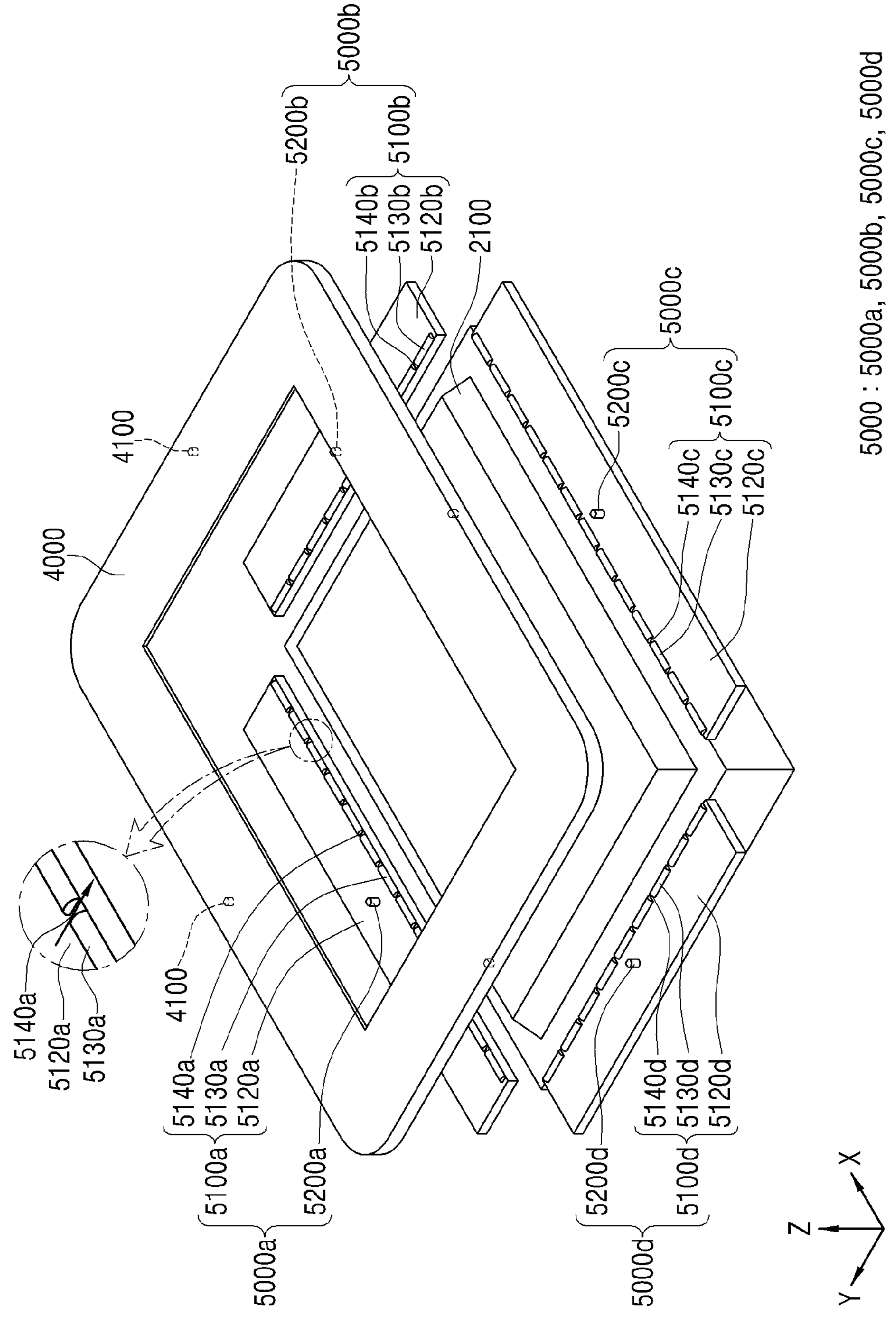
FIGS. 6 and 7 are perspective views showing a gas flow-controlling unit, a substrate support, and an edge frame in the substrate processing apparatus according to the embodiment of the present disclosure.
Figure 7:
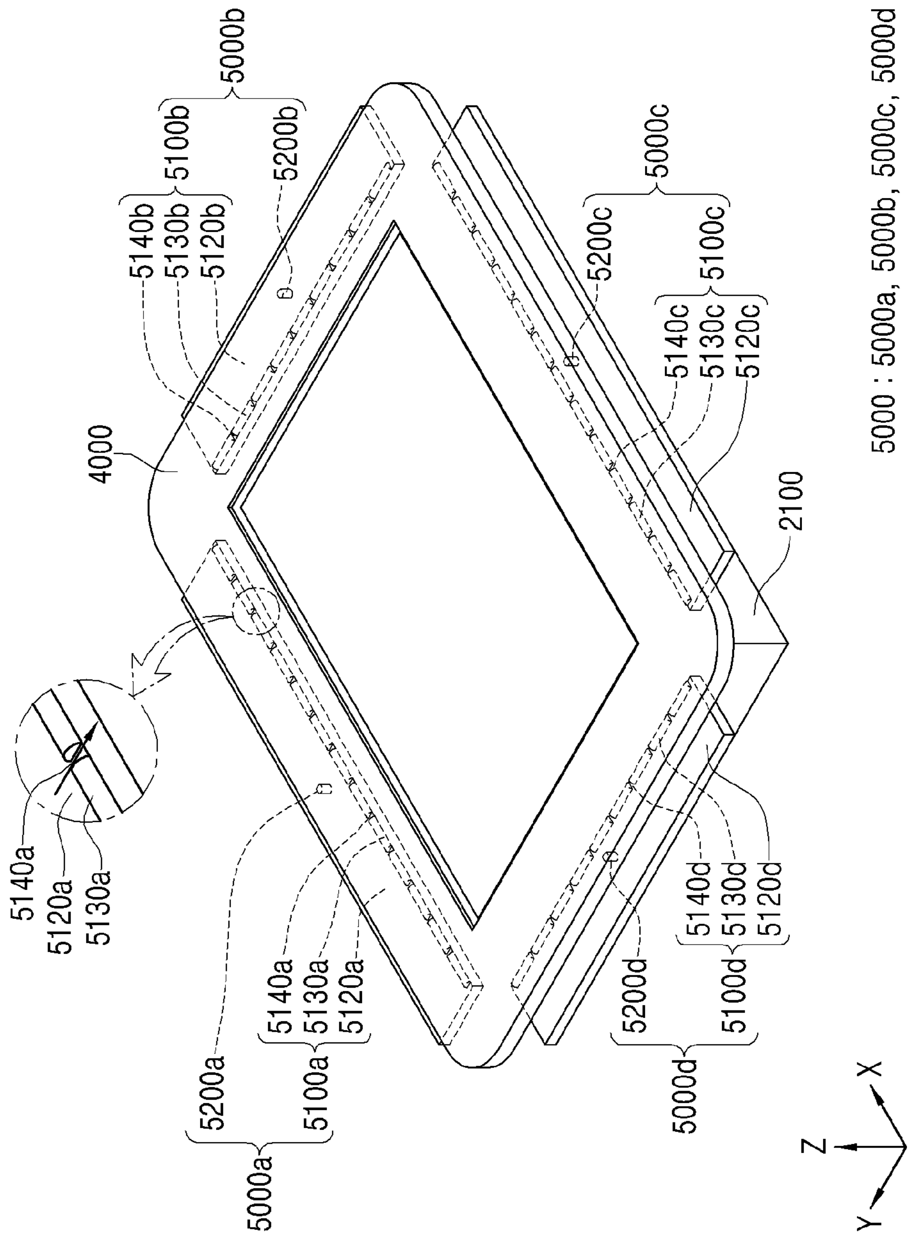

FIGS. 6 and 7 are perspective views showing a gas flow-controlling unit, a substrate support, and an edge frame in the substrate processing apparatus according to the embodiment of the present disclosure. Here, FIG. 6 illustrates a state in which the edge frame is separated from the gas flow-controlling unit, and FIG. 7 illustrates a state in which the edge frame rests on the gas flow-controlling unit. Also, a mask positioned between the substrate support and the edge frame is omitted in FIGS. 6 and 7 for convenience of description.

Referring to FIGS. 1 to 3, the gas flow-controlling unit 5000 may be installed to the side walls 1111*a* to 1111*d* so as to be positioned between the side walls 1111*a* to 1111*d* of the chamber 1000 and the side surface of the substrate support 2100. The gas flow-controlling unit 5000 is provided in plurality so as to be respectively installed on the plurality of side walls 1111*a* to 1111*d* that constitute the side wall section 1110 as illustrated in FIG. 3. That is, four gas flow-controlling units (hereinafter, referred to as first to fourth gas flow-controlling units 5000*a* to 50000*d*) may be provided so as to be installed on the first to fourth side walls 1111*a* to 1111*d* of the side wall section 1110, respectively. In more detail, as illustrated in FIG. 3, a first gas flow-controlling unit 5000*a* is installed on the first side wall 1111*a*, a second gas flow-controlling unit 5000*b* is installed on the second side wall 1111*b*, a third gas flow-controlling unit 5000*c* is installed on the third side wall 1111*c*, and a fourth gas flow-controlling unit 5000*d* is installed on the fourth side wall 1111*d*.

Each of the first to fourth gas flow-controlling units 5000*a* to 5000*d* may have a shape that extends to overlap the width-direction position of the edge frame 4000 that extends outward from the substrate support 2100. Here, for the first and third gas flow-controlling units 5000*a* and the 5000*c* that extend in the first direction (the X-axis direction), the width direction may represent the second direction (the Y-axis direction). Also, for the second and fourth gas flow-controlling units 5000*b* and the 5000*d* that extend in the second direction (the Y-axis direction), the width direction may represent the first direction (the X-axis direction). Accordingly, the first and third gas flow-controlling units 5000*a* and 5000*c* may be provided to partially overlap the position of the edge frame 4000 in the second direction (the Y-axis direction), and the second and fourth gas flow-controlling units 5000*b* and 5000*d* may be provided to partially overlap the position of the edge frame 4000 in the first direction (the X-axis direction).

The first to fourth gas flow-controlling units 5000*a* to 5000*d* are respectively provided with a flow path 5140 (5140*a*, 5140*b*, 5140*c*, 5140*d*), through which the gas may pass, and includes a gas flow-regulating member 5100 (5100*a* to 5100*d*) that extend from the side walls 1111*a* to

1111*d* of the chamber 1000 toward the substrate support 2100 so as to mount or support the edge frame 4000 that is lowering.

Also, the first to fourth gas flow-controlling units 5000*a* to 5000*d* may further include an insertion member 5200 (5200*a* to 5200*d*) that protrudes upward from the gas flow-regulating member 5100 (5100*a* to 5100*d*) so as to be inserted into grooves 4100 provided in the edge frame 4000.

The first to fourth gas flow-regulating members 5100*a* to 5100*d* include: a body 5120 (5120*a* to 5120*d*) installed on the side walls 1111*a* to 1111*d* of the chamber 1000 to extend along the side walls 1111*a* to 1111*d*; and a plurality of protrusion members 5130 (5130*a* to 5130*d*) which protrude upward from the upper surfaces of the body 5120 (5120*a* to 5120*d*) so as to face the edge frame 4000 and are arranged in the extension direction of the body 5120 (5120*a* to 5120*d*) and spaced apart from each other.

Also, the first to fourth gas flow-regulating members 5100*a* to 5100*d* include a flow path 5140 (5140*a* to 5140*d*) which is a space between the protrusion members 5130 (5130*a* to 5130*d*) spaced apart from each other and through which the gas may pass.

The first to fourth bodies 5120*a* to 5120*d* may extend in the extension directions of the first to fourth side walls 1111*a* to 1111*d*, respectively, as illustrated in FIG. 3. Also, the first to fourth bodies 5120*a* to 5120*d* extend from the side walls 1111*a* to 1111*d* toward the substrate support 2100 or the edge frame 4000. The first to fourth bodies 5120*a* to 5120*d* may have a plate shape with a certain thickness.

Hereinafter, for convenience of description, the direction, in which the first to fourth bodies extend in the extension directions of the side walls, is defined as a first width direction, and the direction, in which the first to fourth bodies extend toward the substrate support or the edge frame, is defined as a second width direction.

As described above, the first to fourth bodies 5120*a* to 5120*d* extend in the extension directions of the side walls 1111*a* to 1111*d*. That is, the first body 5120*a* extends in the extension direction (the X-axis direction) of the first side wall 1111*a* and is connected to the first side wall 1111*a*, the second body 5120*b* extends in the extension direction (the Y-axis direction) of the second side wall 1111*b* and is connected to the second side wall 1111*b*, the third body 5120*c* extends in the extension direction (the X-axis direction) of the third side wall 1111*c* and is connected to the third side wall 1111*c*, and the fourth body 5120*d* extends in the extension direction (the Y-axis direction) of the fourth side wall 1111*d* and is connected to the fourth side wall 1111*d*.

When the first to fourth bodies 5120*a* to 5120*d* extend in the extension directions of the first to fourth side walls 1111*a* to 1111*d*, respectively, the extension lengths thereof may be less than the extension lengths of the first to fourth side walls 1111*a* to 1111*d*, respectively. Also, the first to fourth bodies 5120*a* to 5120*d* may be arranged such that the centers thereof in the extension directions coincide with the centers of the side walls 1111*a* to 1111*d*. Also, the first to fourth bodies 5120*a* to 5120*d* may be positioned in the central regions $A_{C1}$, $A_{C2}$, $A_{C3}$, and $A_{C4}$ of the first to fourth side walls 1111*a* to 1111*d*, respectively. That is, the first body 5120*a* is installed in the central region $A_{C1}$ of the first side wall 1111*a*, the second body 5120*b* is installed in the central region $A_{C2}$ of the second side wall 1111*b*, the third body 5120*c* is installed in the central region $A_{C3}$ of the third side wall 1111*c*, and the fourth body 5120*d* is installed in the central region $A_{C4}$ of the fourth side wall 1111*d*. In other words, the first to fourth bodies 5120*a* to 5120*d* may be installed in regions except for the edges $A_{E1}$, $A_{E2}$, $A_{E3}$, and $A_{E4}$ of the first to fourth side walls 1111*a* to 1111*d*. Also, in other words, the bodies 5120*a* to 5120*d* may be installed in regions except for the corners $C_1$ to $C_4$ of the side wall section 1110 divided by the first to fourth side walls 1111*a* to 1111*d*.

The first to fourth bodies 5120*a* to 5120*d* may be installed and fixed to the first to fourth side walls 1111*a* to 1111*d* so as to be connected thereto. When the first body 5120*a* is described as an example, the first body 5120*a* is installed such that a front end (hereinafter, referred to as one end) among both ends in the second width direction faces the substrate support 2100 or the edge frame 4000, and the opposite end thereof is connected to the first side wall 1111*a* of the chamber 1000. In other words, the first body 5120*a* is provided such that one end thereof faces the side surface of the substrate support 2100 or the edge frame 4000, and the other end thereof is connected to the first side wall 1111*a*.

The second to fourth bodies 5120*b* to 5120*d* are provided in the same or similar manner as the first body 5120*a*. That is, one end of each of the second to fourth bodies 5120*b* to 5120*d* faces the substrate support 2100 or the edge frame 4000, and the other end is connected to the side walls 1111*b* to 1111*d*.

Each of the first to fourth bodies 5120*a* to 5120*d* is provided such that some regions thereof overlap the edge frame 4000 in the second width direction. For example, the first body 5120*a* overlaps the edge frame 4000 in the second direction (the Y-axis direction). Here, the first body 5120*a* overlaps the edge frame 4000 so that one end thereof may be supported. That is, a region of the first body 5120*a* spaced a certain distance from one end among both ends toward the other end in the second width direction (the Y-axis direction) is provided at the same position as at least a portion of the edge frame 4000 present outside of the substrate support 2100. Accordingly, the first body 5120*a* is disposed such that some regions including the one end thereof overlap the edge frame 4000. In other words, some regions, including the one end, of the first body 5120*a* overlap at least a portion of the edge frame 4000 that protrudes outward from the substrate support 2100 toward the first side wall 1111*a*. Accordingly, some regions, including the one end, on the upper surface of the first body 5120*a* overlaps and faces the lower surface of the edge frame 4000, and the other regions thereof do not face the lower surface of the edge frame 4000 but are present outside of the edge frame 4000.

The second to fourth bodies 5120*b* to 5120*d* are provided in the same or similar manner as the first body 5120*a* as described above. That is, the second to fourth bodies 5120*b* to 5120*d* overlap the edge frame 4000 so as to face the lower surface of the edge frame 4000 that protrudes from the substrate support 2100 toward the second to fourth side walls 1111*b* to 1111*d*.

Hereinafter, for convenience of description, the region of each of the first to fourth bodies 5120*a* to 5120*d* overlaying or overlapping the edge frame 4000 is referred to as a first region 5121, and the other regions are referred to as a second region 5122.

When explained again on the basis of the above, the first region 5121 on the upper surface of each of the first to fourth bodies 5120*a* to 5120*d* overlaps the edge frame 4000, and the second region 5122 other than the first region 5121 extends to be positioned outside the edge frame 4000. Accordingly, in each of the first to fourth bodies 5120*a* to 5120*d*, the first region 5121 overlays or overlaps the position of the lower surface of the edge frame 4000, and the second region 5122 is exposed through a space between the side walls 1111*a* to 1111*d* of the chamber 1000 and the edge frame 4000.

The first to fourth protrusion members 5130*a* to 5130*d* may be means for making paths or gaps, through which the gas passes, when the edge frame 4000 is placed or mounted to the gas flow-controlling unit. The first to fourth protrusion members 5130*a* to 5130*d* protrude upward from the bodies 5120*a* to 5120*d*, respectively, so as to be directed toward the edge frame 4000. In more detail, the first to fourth protrusion members 5130*a* to 5130*d* protrude upward from the upper surfaces of the first to fourth bodies 5120*a* to 5120*d*.

Also, the first to fourth protrusion members 5130*a* to 5130*d* are arranged at the positions that face the lower surface of the edge frame 4000. When the first protrusion member 5130*a* is described as an example, the first protrusion member 5130*a* is located in the first region 5121 of the first body 5120*a* and protrudes from the upper surface of the first body 5120*a*. Here, the first region 5121 of the first body 5120*a* is a region that overlaps the width-direction position of the edge frame 4000 protruding outward from the substrate support 2100. Thus, as the first protrusion member 5130*a* is provided in the first region 5121, the first protrusion member 5130*a* may face the edge frame 4000. More specifically, the first protrusion member 5130*a* may be provided relatively close to the one end among both the ends of the first body 5120*a*.

The first protrusion member 5130*a* is provided in plurality, and the plurality of first protrusion members 5130*a* are arranged in the first width direction (the X-axis direction) of the first body 5120*a* or the extension direction (the X-axis direction) of the first side wall 1111*a* and spaced apart from each other as illustrated in FIGS. 3, 6, and 7. As the plurality of first protrusion members 5130*a* are spaced apart from each other as described above, empty spaces are provided between the first protrusion members 5130*a* adjacent to each other. These empty spaces and spaced spaces serve as a flow path (a first flow path 5140*a*) through which the gas passes. Accordingly, the first gas flow-regulating member 5100*a* include a plurality of first flow paths 5140*a* arranged in the extension direction of the first side wall 1111*a*, and the plurality of first flow paths 5140*a* may be provided by the plurality of first protrusion members 5130*a* that are arranged in the extension direction of the first side wall 1111*a* and spaced apart from each other. Also, as described above, the first flow path 5140*a* provided between the two first protrusion members 5130*a* spaced apart from each other may have a slit shape.

The second to fourth protrusion members 5130*b* to 5130*d* are provided in the same manner as the first protrusion member 5130*a*. That is, the second to fourth protrusion members 5130*b* to 5130*d* are located in the first regions 5121 of the second to fourth bodies 5120*b* to 5120*d*, respectively. Also, the second to fourth protrusion members 5130*b* to 5130*d* may be provided relatively close to the one end among both the ends of the second to fourth bodies 5120*b* to 5120*d*, respectively.

In the above description, the example has been described in which the first to fourth protrusion members 5130*a* to 5130*d* are located close to one end of the first to fourth bodies 5120*a* to 5120*d*, respectively. However, the embodiment is not limited thereto, and each of the first to fourth protrusion members 5130*a* to 5130*d* may be located at any position on the first regions 5121 of the bodies 5120*a* to 5120*d*.

The second to fourth protrusion members 5130*b* to 5130*d* are provided in plurality and spaced apart from each other, like the first protrusion member 5130*a* as described above. That is, the plurality of second protrusion members 5130*b*, the plurality of third protrusion members 5130*c*, and the plurality of fourth protrusion members 5130*d* are arranged in the second width directions of the second to fourth bodies 5120*b* to 5120*d* or the extension directions of the second to fourth side walls 1111*b* to 1111*d* and spaced apart from each other as illustrated in FIGS. 3, 6, and 7. Accordingly, flow paths 5140*b* to 5140*d*, through which the gas may pass, are provided in the spaces between the second protrusion members 5130*b*, the spaces between the third protrusion members 5130*c*, and the spaces between the fourth protrusion members 5130*d*. Thus, the second to fourth flow paths 5140*b* to 5140*d* may have the same or similar shape as the first flow path 5140*a* described above and may have a slit shape.

In each of the first to fourth protrusion members 5130*a* to 5130*d* described above, it is preferable that the upper surface thereof facing the edge frame 4000 has a convex curved surface as illustrated in FIGS. 6 and 7. Here, when the upper surface of each of the first to fourth protrusion members 5130*a* to 5130*d* is provided in the form of a curved surface, the curved surface has curvature that curves in the second width directions of the bodies 5120*a* to 5120*d*.

Also, each of the first to fourth protrusion members 5130*a* to 5130*d* may have a bar shape that extends in the second width direction of each of the bodies 5120*a* to 5120*d*. Accordingly, in each of the first to fourth protrusion members 5130*a* to 5130*d*, the shape of the cross-section thereof may be a bar shape with a semicircle as illustrated in FIGS. 6 and 7. Of course, the shapes of the first to fourth protrusion members 5130*a* to 5130*d* are not limited to the example described above, and the shapes thereof may be diversely changed as long as the lower surface of the edge frame 4000 may rest thereon.

As described above, the plurality of protrusion members provided separately are arranged in the extension directions of the bodies or the side walls and spaced apart from each other, and thus, the flow paths are provided between the neighboring protrusion members.

However, the embodiment is not limited thereto, and a single protrusion member may extend in the extension direction of the body. Also, a plurality of holes, through which the gas passes, may be provided in the protrusion member, and the plurality of holes may be arranged in the extension direction of the protrusion member or the body and spaced apart from each other. Also, a hole may pass through the protrusion member in a direction crossing or perpendicular to the extension direction of the protrusion member or the body. In other words, the hole may pass through the protrusion member in a direction from the side wall of the chamber toward the substrate support. This hole provided in the protrusion member serves as the flow path of the gas flow-controlling unit.

Although not illustrated, when the first protrusion member 5130*a* is described as an example, a single first protrusion member 5130*a* may extend in the first width direction (the X-axis direction) of the first body 5120*a* or the extension direction (the X-axis direction) of the first side wall 1111*a*. Also, a plurality of holes are provided in the first protrusion member 5130*a*, and each of the holes may pass through the first protrusion member 5130*a* in a direction from the first side wall 1111*a* toward the substrate support 2100. Also, the plurality of holes may be arranged in the extension direction of the first protrusion member 5130*a* and spaced apart from each other. These holes provided in the first protrusion member 5130*a* serve as the first flow path 5140*a*.

Also, holes are also provided in the second to fourth protrusion members 5130*b* to 5130*d* in the same manner as the above, and these holes are the second to fourth flow paths 5140*b* to 5140*d*.

A plurality of insertion members 5200 (5200*a* to 5200*d*) are installed on the bodies 5120*a* to 5120*d* of the first to fourth gas flow-regulating members 5100*a* to 5100*d*, respectively. When the first insertion member 5200*a* is described as an example, the first insertion member 5200*a* may protrude upward from the upper surface of the first body 5120*a* toward the edge frame 4000. Here, the first insertion member 5200*a* may face a groove 4100 that is provided in the edge frame 4000 protruding from the substrate support 2100 toward the first side wall 1111*a*. That is, the first insertion member 5200*a* may be located, behind the first protrusion member 5130*a*, on the first region 5121 of the first body 5120*a*. Here, the region behind the first protrusion member 5130*a* may represent the opposite side from the substrate support 2100 with respect to the first protrusion member 5130*a*, and the region in front of the first protrusion member 5130*a* may represent the side toward the substrate support 2100.

The second to fourth insertion members 5200*b* to 5200*d* may be provided in the same manner as the first insertion member 5200*a* described above. That is, the second to fourth insertion members 5200*b* to 5200*d* may protrude upward from the upper surfaces of the second to fourth bodies 5120*b* to 5120*d* toward the edge frame 4000. Also, the second to fourth insertion members 5200*b* to 5200*d* may be located, behind the second to fourth protrusion members 5130*b* to 5130*d*, on the first regions 5121 of the second to fourth bodies 5120*b* to 5120*d*, respectively.

As the gas flow-controlling units 5000*a* to 5000*d* are installed in the first to fourth side walls 1111*a* to 1111*d*, respectively, as described above, the movements of the gas toward the corners $C_1$ to $C_4$ may be induced. In other words, the gas flow-controlling units 5000*a* to 5000*d* are installed in regions other than the corners $C_1$ to $C_4$ in the side wall section 1110, and thus, it is possible to increase the amount of gas moving toward the corners $C_1$ to $C_4$ compared to when the gas flow-controlling units 5000*a* to 5000*d* are not installed.

This is because the bodies 5120*a* to 5120*d* of the gas flow-regulating members 5100*a* to 5100*d* installed on the side walls 1111*a* to 1111*d* serve to hinder or block the movements of the gas. That is, the bodies 5120*a* to 5120*d* of the first to fourth gas flow-regulating members 5100*a* to 5100*d* extend from the side walls 1111*a* to 1111*d* toward the opposite side. Also, the bodies 5120*a* to 5120*d* are provided such that the width-direction position of the first regions 5121 overlap the edge frame 4000. Accordingly, second regions of the bodies 5120*a* to 5120*d* are arranged between the side walls 1111*a* to 1111*d* and the edge frame 4000. Therefore, for a gas flowing from the edge frame 4000 toward the central regions of the side walls 1111*a* to 1111*d*, the downward movement of the gas may be hindered by the bodies 5120*a* to 5120*d* located below the gas. Also, the first to fourth bodies 5120*a* to 5120*d* are installed in regions other than the corners $C_1$ to $C_4$ in the side wall section 1110. Therefore, a component for hindering the movement of the gas is not present between the corners $C_1$ to $C_4$ of the side wall section 1110 and the edge frame 4000. Therefore, the gas of which movement is hindered by the first to fourth bodies 5120*a* to 5120*d* is directed toward the corners $C_1$ to $C_4$ at which the first to fourth bodies 5120*a* to 5120*d* are not provided. Therefore, the amount of the gas passing through between the corners $C_1$ to $C_4$ of the side wall section 1110 and the edge frame 4000 is increased. Accordingly, when the cleaning gas is sprayed into the chamber 1000, the amount of the gas directed toward the corners $C_1$ to $C_4$ of the chamber 1000 may be increased, and impurities attached to the corners $C_1$ to $C_4$ may be easily cleaned. Therefore, it is possible to prevent cleaning defects from occurring at the corners $C_1$ to $C_4$.

Also, the first to fourth gas flow-regulating members 5100*a* to 5100*d* are provided with the flow paths 5140*a* to 5140*d*, respectively, through which the gas may pass. Accordingly, even if the edge frame 4000 is lowered and the lower surface thereof rests on the protrusion members 5130*a* to 5130*d* of the gas flow-regulating members 5100*a* to 5100*d*, the gas may move downward from the gas flow-regulating members 5100*a* to 5100*d* via the flow paths 5140*a* to 5140*d*.

In more detail, when the edge frame 4000 is lowered by the substrate support 2100, the lower surface of the edge frame 4000 rests on the protrusion members 5130*a* to 5130*d* of the gas flow-regulating members 5100*a* to 5100*d*, respectively. Here, a gap is formed, by the protrusion members 5130*a* to 5130*d*, between the lower surface of the edge frame 4000 and the upper surface of the bodies 5120*a* to 5120*d*. That is, the gap is formed between the lower surface of the edge frame 4000 and the first regions 5121 on the upper surfaces of the bodies 5120*a* to 5120*d*. Accordingly, the gas flowing from the edge frame 4000 toward the central regions $A_{C1}$, $A_{C2}$, $A_{C3}$, and $A_{C4}$ of the side walls 1111*a* to 1111*d* may pass through the spaces between the edge frame 4000 and the side walls 1111*a* to 1111*d* and then flow in via the gaps between the edge frame 4000 and the bodies 5120*a* to 5120*d*.

However, the protrusion members 5130*a* to 5130*d* are provided on the opposite side from inlets in which the gas flows in between the edge frame 4000 and the bodies 5120*a* to 5120*d*, and the edge frame 4000 is in contact with the upper surfaces of the protrusion members 5130*a* to 5130*d*. Accordingly, the movement of the gas, which has flowed in between the edge frame 4000 and the bodies 5120*a* to 5120*d*, is blocked by the protrusion members 5130*a* to 5130*d*. Therefore, even if a gas flows in via the gaps between the edge frame 4000 and the bodies 5120*a* to 5120*d*, the gas may not move toward the substrate support 2100 and thus may not move downward. Therefore, the gas flowing from the edge frame 4000 toward the central regions $A_{C1}$, $A_{C2}$, $A_{C3}$, and $A_{C4}$ of the side walls 1111*a* to 1111*d* may be hindered from moving downward by the bodies 5120*a* to 5120*d* and the protrusion members 5130*a* to 5130*d* located below the gas. Accordingly, the gas of which movement is hindered by the bodies 5120*a* to 5120*d* and the protrusion members 5130*a* to 5130*d* is directed toward the corners $C_1$ to $C_4$. Accordingly, the amount of the gas flowing toward the central regions $A_{C1}$, $A_{C2}$, $A_{C3}$, and $A_{C4}$ of the side walls 1111*a* to 1111*d* is reduced, and the absolute quantity thereof may also become small. In this case, a cleaning defect may occur at the central regions $A_{C1}$, $A_{C2}$, $A_{C3}$, and $A_{C4}$ of the side walls 1111*a* to 1111*d*.

However, the gas flow-regulating members 5100*a* to 5100*d* according to the embodiment are provided with the flow paths 5140*a* to 5140*d*, respectively, through which the gas may pass. That is, the plurality of protrusion members 5130*a* to 5130*d* are spaced apart from each other, and the flow paths 5140*a* to 5140*d*, through which the gas may pass, are provided between the neighboring protrusion members.

Thus, the gas, which has flowed in between the edge frame 4000 and the bodies 5120*a* to 5120*d*, may pass through the flow paths 5140*a* to 5140*d* provided between the protrusion members 5130*a* to 5130*d* and move to the outside of the bodies 5120*a* to 5120*d*. That is, the gas, which has flowed in between the edge frame 4000 and the bodies 5120*a* to 5120*d*, may pass through the flow paths 5140*a* to 5140*d* and move to spaces between the bodies 5120*a* to 5120*d* and the substrate support 2100, and then may move downward from the bodies 5120*a* to 5120*d* and the substrate support 2100.

As described above, as the flow paths are secured in the gas flow-regulating members 5100*a* to 5100*d*, the flow may be induced so that the gas may move toward the central regions $A_{C1}$, $A_{C2}$, $A_{C3}$, and $A_{C4}$ of the side walls 1111*a* and 1111*d*. Accordingly, the amount of the gas directed toward the central regions $A_{C1}$, $A_{C2}$, $A_{C3}$, and $A_{C4}$ of the side walls 1111*a* to 1111*d* is increased when the gas flow-regulating members 5100*a* to 5100*d* are provided with the flow paths 5140*a* to 5140*d*, compared to the case in which the gas flow-regulating members are not provided with the flow paths. As described above, as the amount of the cleaning gas, which is directed toward regions other than the corners $C_1$ to $C_4$ of the chamber 1000, that is, toward the central regions $A_{C1}$, $A_{C2}$, $A_{C3}$, and $A_{C4}$ of the side walls 1111*a* to 1111*d*, is increased, impurities attached to the regions other than the corners $C_1$ to $C_4$ may be easily cleaned. Therefore, it is possible to prevent cleaning defects from occurring at the regions other than the corners $C_1$ to $C_4$, that is, the central regions $A_{C1}$, $A_{C2}$, $A_{C3}$, and $A_{C4}$ of the side walls 1111*a* to 1111*d*.

Figure 8:
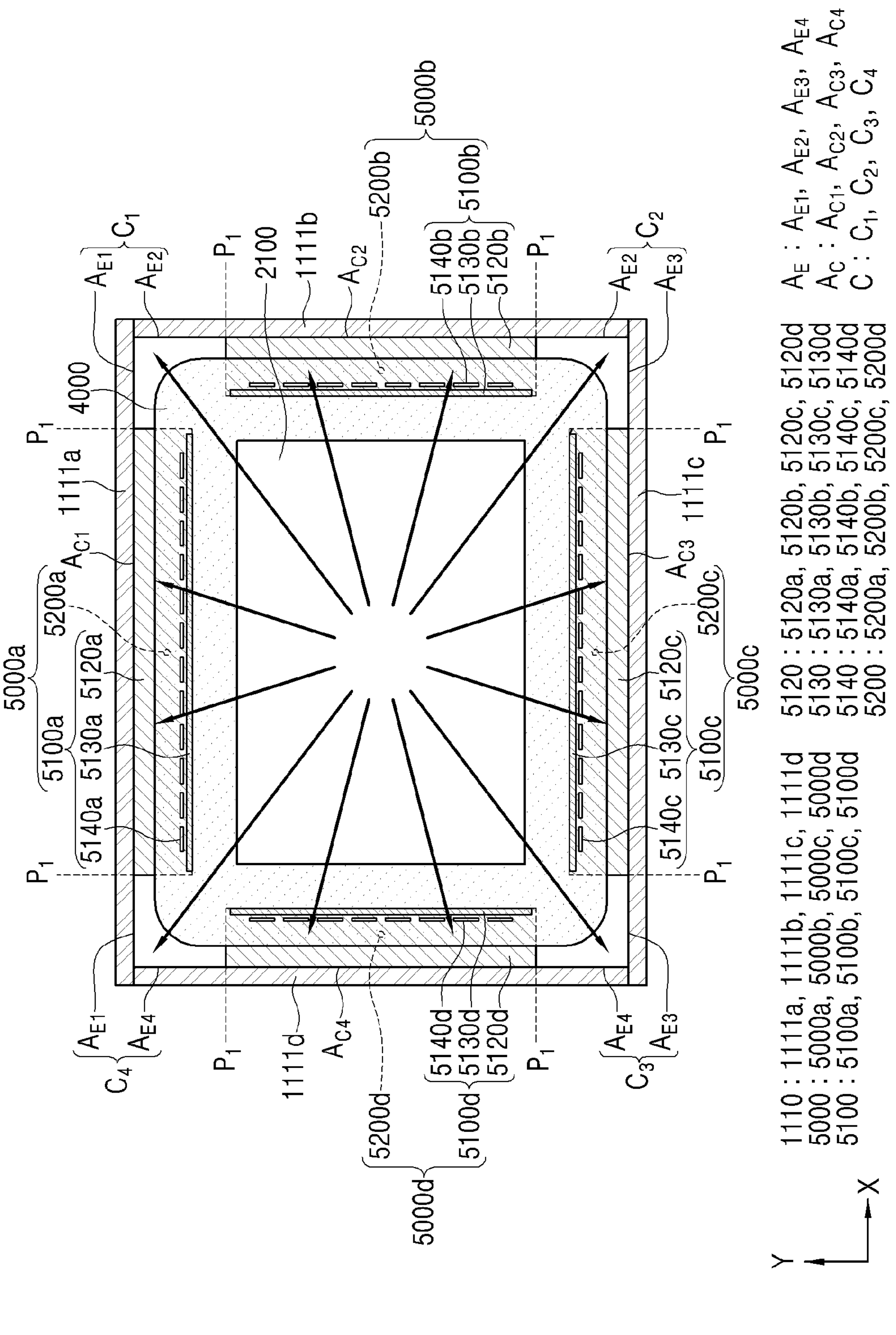
FIG. 8 is a plan view when a substrate processing apparatus according to another embodiment of the present disclosure is viewed from above an edge frame.
Figure 9:
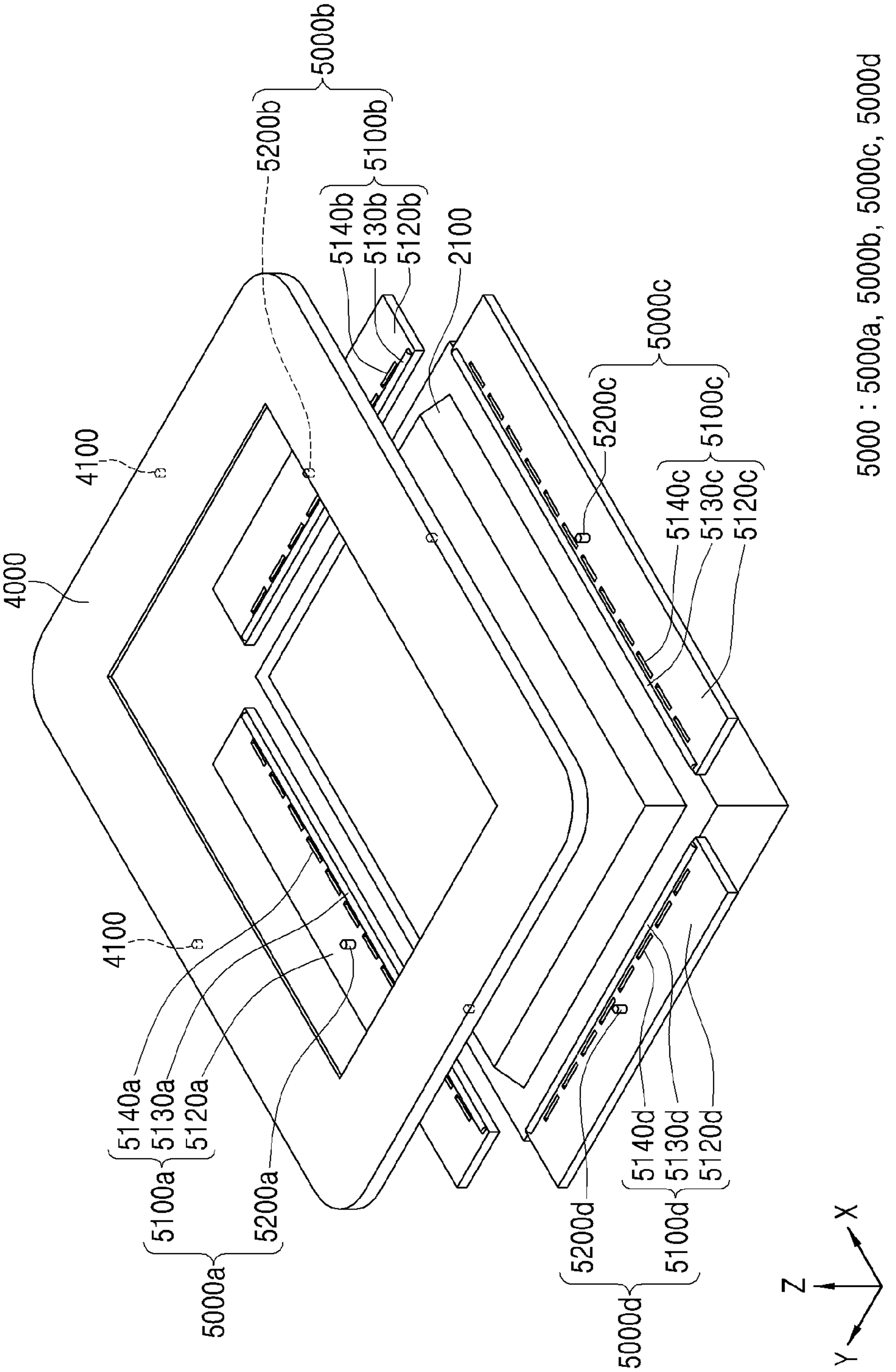
FIGS. 9 and 10 are perspective views showing a gas flow-controlling unit, a substrate support, and an edge frame in the substrate processing apparatus according to another embodiment of the present disclosure.
Figure 10:
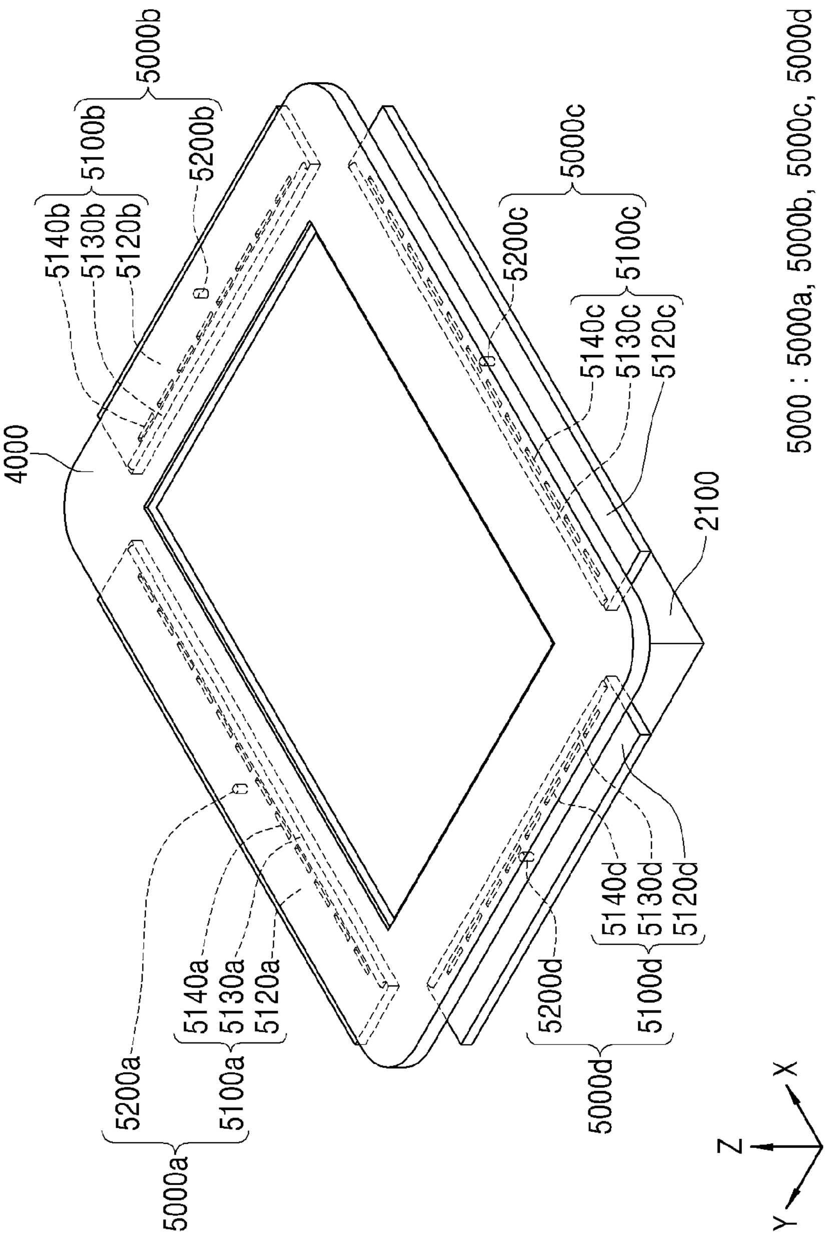
Figure 11:
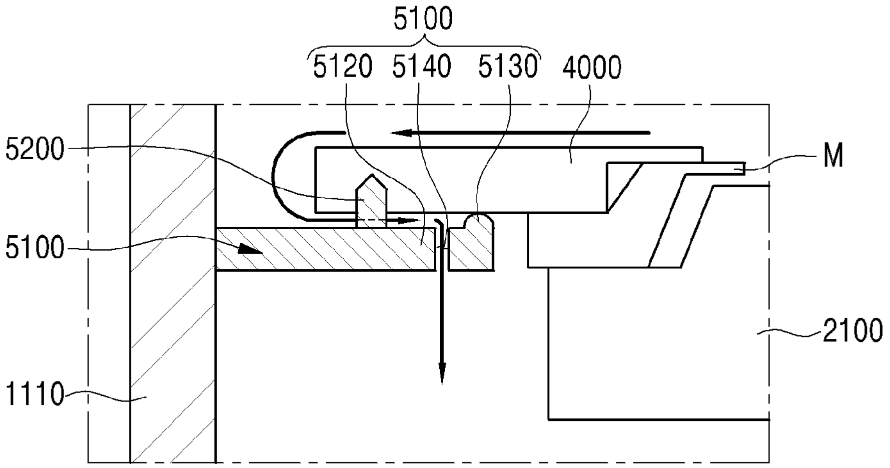
FIG. 11 is an enlarged front view showing a portion of a state in which the edge frame rests on the gas flow-controlling unit in the substrate processing apparatus according to another embodiment of the present disclosure.

FIG. 8 is a plan view when a substrate processing apparatus according to another embodiment of the present disclosure is viewed from above an edge frame. FIGS. 9 and 10 are perspective views showing a gas flow-controlling unit, a substrate support, and an edge frame in the substrate processing apparatus according to another embodiment of the present disclosure. FIG. 11 is an enlarged front view showing a portion of a state in which the edge frame rests on the gas flow-controlling unit in the substrate processing apparatus according to another embodiment of the present disclosure.

Here, FIG. 9 illustrates a state in which the edge frame is separated from the gas flow-controlling unit, and FIG. 10 illustrates a state in which the edge frame rests on the gas flow-controlling unit. Also, a mask positioned between the substrate support and the edge frame is omitted in FIGS. 9 and 10 for convenience of description.

In the embodiment described above, the plurality of protrusion members 5130*a* to 5130*d* are spaced apart from each other, and the flow paths 5140*a* to 5140*d*, through which the gas may pass, are provided. However, the embodiment is not limited thereto, and flow paths may be provided in another way.

That is, in another embodiment illustrated in FIGS. 8 to 11, first to fourth gas flow-regulating members 5100*a* to 5100*d* may include: bodies 5120*a* to 5120*d*; protrusion members 5130*a* to 5130*d* provided in the form of a single body and extending in second width directions of the bodies 5120*a* to 5120*d*; and flow paths 5140*a* to 5140*d* formed behind the protrusion members 5130*a* to 5130*d* and passing through the bodies 5120*a* to 5120*d* in the up-down direction.

Here, each of the flow paths of the first to fourth gas flow-regulating members 5100*a* to 5100*d*, that is, the first to fourth flow paths 5140*a* to 5140*d* may be provided in plurality. Also, the plurality of first to fourth flow paths 5140*a* to 5140*d* may be arranged in first width directions of the bodies 5120*a* to 5120*d*. That is, the plurality of first flow paths 5140*a* are arranged in the first width direction (the X-axis direction) of the first body 5120*a*, the plurality of second flow paths 5140*b* are arranged in the first width direction (the Y-axis direction) of the second body 5120*b*, the plurality of third flow paths 5140*c* are arranged in the first width direction (the X-axis direction) of the third body 5120*c*, and the plurality of fourth flow paths 5140*d* are arranged in the first width direction (the Y-axis direction) of the fourth body 5120*d*. Also, each of the first to fourth flow paths 5140*a* to 5140*b* are provided in the form of a slit as illustrated in FIGS. 8 to 10.

According to the gas flow-regulating members 5100*a* to 5100*d* described above, the gas, which has flowed in between the edge frame 4000 and the bodies 5120*a* to 5120*d*, may pass through the flow paths 5140*a* to 5140*d* provided behind the protrusion members 5130*a* to 5130*d* and move downward from the bodies 5120*a* to 5120*d*.

In another embodiment, the first to fourth flow paths 5140*a* to 5140*d* may have a slit shape that extends in the extend directions of the bodies 5120*a* to 5120*d*, respectively.

However, the embodiment is not limited thereto, and the first to fourth flow paths 5140*a* to 5140*d* may have a hole shape (not shown). The first to fourth flow paths 5140*a* to 5140*d* pass through the bodies 5120*a* to 5120*d* in the up-down direction, and each of the holes may have a shape which does not extend in the extension directions of the bodies 5120*a* to 5120*d* or has a short extension length, that is, may have a circular shape.

When the first flow path 5140*a* is described as an example, a hole may be provided, which is formed behind the first protrusion member 5130*a* and passes through the first body 5120*a* in the up-down direction. Here, the hole may not extend in the extension direction of the first body 5120*a* or have a very short extension length, for example, may have a circular shape. Also, the hole may be provided in plurality, and the plurality of holes may be arranged in the extension direction of the first body 5120*a* and spaced apart from each other. Each of the plurality of holes provided in the first body 5120*a* described above serves as the first flow path 5140*a*.

Also, the second to fourth flow paths 5140*b* to 5140*d* may be provided in the form of holes in the second to fourth bodies 5120*b* to 5120*d* in the same manner as that described above.

Also, although not illustrated, the first to fourth gas flow-controlling units 5000*a* to 5000*d* may include all of the first to fourth flow paths 5140*a*, 5140*b*, 5140*c*, and 5140*d* according to the embodiment described above and the first to fourth flow paths 5140*a*, 5140*b*, 5140*c*, and 5140*d* according to another embodiment.

In the embodiments described above, a remote plasma generator is connected to the chamber 1000. However, the embodiment is not limited thereto, and the substrate processing apparatus may be replaced with a direct plasma apparatus that activates a gas inside a chamber 1000 to generate plasma. That is, a spray unit 3000 and a substrate support 2100 are utilized as electrodes to apply RF power, and thus, the plasma may be generated between the spray unit 3000 and the substrate support 2100.

Figure 12:
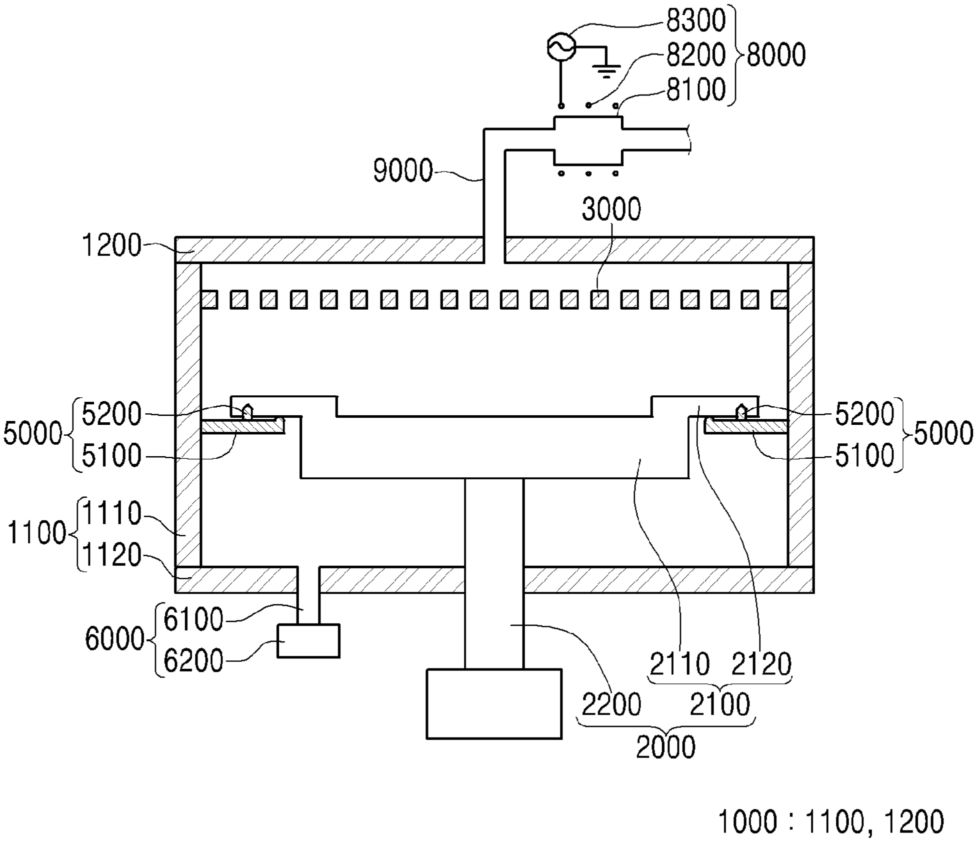
FIG. 12 is a view illustrating a substrate processing apparatus according to a modified example of the embodiment.

FIG. 12 is a view illustrating a substrate processing apparatus according to a modified example of the embodiment.

In the embodiment described above, the substrate support 2100 and the edge frame 4000 are provided as separate components. Thus, when the substrate support is further lowered after the edge frame 4000 is mounted or placed on the gas flow-controlling unit 5000, the substrate support 2100 and the edge frame 4000 are separated from each other.

However, the embodiment is not limited thereto. As in the modified example of FIG. 12, a substrate support 2100 itself may include the edge frame described in the embodiment. That is, as illustrated in FIG. 12, a substrate support 2100 is disposed to face a spray unit 3000 inside a chamber 1000, and may include: a support member 2110 having the upper surface on which a substrate S rests; and an edge frame 2120 positioned above the support member 2110 so as to extend outward from the width-direction edge of the support member 2110. Here, the substrate support 2100 is described as including the support member 2110 and the edge frame 2120 for convenience of description, but the support member 2110 and the edge frame 2120 may be integrated with each other.

Here, the edge frame 2120 of the substrate support 2100 according to the modified example has a shape similar to that of the edge frame according to the embodiment described above. That is, the edge frame 2120 of the substrate support 2100 according to the modified example has a shape, which extends from the edge of the support member 2110 in the width direction to the outside of the support member 2110 so as to expose a substrate S resting on the support member 2110, and is disposed above the support member 2110. That is, the edge frame 2120 may have a hollow shape that covers the edge of the upper surface of the support member 2110, on which the substrate S rests, and exposes the remainder of the upper surface as illustrated in FIG. 12.

The edge frame 2120 may extend from the edge of the support member 2110 toward a side wall section 1110 of the chamber 1000. Accordingly, a portion of the edge frame 2120 faces the support member 2110, and the remainder is located outside the support member 2110. That is, a portion of the edge frame 2120 overlaps the position of the support member 2110 in the width direction, and the remainder thereof is located outside the support member 2110 in the width direction.

Hereinafter, operation of the substrate processing apparatus according to the embodiment of the present disclosure will be described with reference to FIGS. 1 to 7. Here, operation of cleaning the inside of a chamber by spraying a cleaning gas is described, When deposition processes have been performed a plurality of times or a certain number of times, the inside of the chamber 1000 is cleaned. When the edge frame 4000 is spaced upward from the gas flow-controlling unit 5000 and the substrate S is not supported on the substrate support 2100, the actuator 2200 is operated first to lower the substrate support 2100 and the edge frame 4000. Here, the substrate support 2100 is lowered so that the edge frame 4000 rests on the gas flow-controlling unit 5000 as illustrated in FIGS. 2 and 5. That is, the substrate support 2100 is lowered, and the lower surface of the edge frame 4000 that protrudes to the outside of the substrate support 2100 is brought into contact with the upper portions of the protrusion members 5130*a* to 5130*d* of the first to fourth gas flow-regulating members 5100*a* to 5100*d* as illustrated in FIGS. 2 and 5.

When the edge frame 4000 rests on the gas flow-regulating members 5100*a* to 5100*d*, the insertion members 5200*a* to 5200*d* are inserted into the grooves 4100 provided in the edge frame 4000. Accordingly, the edge frame 4000 and the gas flow-regulating members 5100*a* to 5100*d* may be aligned with each other.

In another example, when the substrate S rests on the substrate support 2100 after the deposition process is completed, the substrate S is separated from the substrate support 2100 first. For this, the substrate support 2100 is lowered by the actuator 2200, and the edge frame 4000 rests on the gas flow-controlling unit 5000 as illustrated in FIGS. 2 and 5. Also, when the substrate support 2100 is further lowered by the actuator 2200, the edge frame 4000 and the mask M are separated from the substrate support 2100. Subsequently, the substrate S resting on the substrate support 2100 is discharged outside the chamber 1000. Next, the substrate support 2100 is raised to a position adjacent to the edge frame 4000 by the actuator 2200. That is, as illustrated in FIG. 2, the substrate support 2100 is raised so that the upper surface of the substrate support 2100 may come into contact with the mask M mounted to the lower portion of the edge frame 4000. Here, for example, when the mask M is not mounted to the lower portion of the edge frame 4000, the upper surface of the substrate support 2100 is raised to come into contact with the lower surface of the edge frame 4000.

When the edge frame 4000 rests on the first to fourth gas flow-controlling units 5000*a* to 5000*d*, the cleaning gas is sprayed into the chamber 1000. For this, the cleaning gas is supplied to the container 8100 which is positioned outside the chamber 1000, and the RF power is applied by the antenna 8200. Accordingly, the cleaning gas is activated inside the container 8100 to generate plasma, and the activated cleaning gas is supplied between the cover 1200 of the chamber 1000 and the spray unit 3000 via the supply pipe 9000. The cleaning gas is sprayed downward via the plurality of flow paths provided in the spray unit 3000.

The cleaning gas, which is sprayed by the spray unit 3000 toward the lower side thereof, that is, the substrate support 2100 and the edge frame 4000, is moved toward the side wall section 1110 of the chamber 1000 as illustrated in FIG. 3. That is, the gas, which is sprayed on the upper portions of the substrate support 2100 and the edge frame 4000, is moved toward the corners $C_1$ to $C_4$ of the side wall section 1110 and regions other than the corners $C_1$ to $C_4$. More specifically, the gas is moved toward the first to fourth corners $C_1$ to $C_4$ of the side wall section 1110 and the central regions $A_{C1}$, $A_{C2}$, $A_{C3}$, and $A_{C4}$ of the first to fourth side walls 1111*a* to 1111*d*.

Here, the gas, which has moved toward the first to fourth corners $C_1$ to $C_4$ of the side wall section 1110, moves downward from the edge frame 4000 and the substrate support 2100 via the space between the edge frame 4000 and the first to fourth corners $C_1$ to $C_4$.

Also, the gas, which has moved toward the central regions $A_{C1}$, $A_{C2}$, $A_{C3}$, and $A_{C4}$ of the first to fourth side walls 1111*a* to 1111*d*, moves to the spaces between the edge frame 4000 and the first to fourth side walls 1111*a* to 1111*d*, and then flows in the gaps between the first to fourth bodies 5120*a* to 5120*d* and the edge frame 4000 which are vertically disposed. Then, the gas flowing therein exits via the flow paths 5140*a* to 5140*d* provided in the first to fourth bodies 5120*a* to 5120*d* as illustrated in the enlarged views of FIGS. 5 and 7. That is, the gas passes through the flow paths 5140*a* to 5140*d* which are the spaces between the plurality of protrusion members 5130*a* to 5130*d* provided above the first to fourth bodies 5120*a* to 5120*d*. Subsequently, the gas, which has passed through the flow paths 5140*a* to 5140*d*, moves downward via the spaces between the first to fourth bodies 5120*a* to 5120*d* and the substrate support 2100 and is then discharged via the exhaust unit 6000.

As described above, the gas, which has sprayed from the spray unit 3000, is evenly distributed by the plurality of gas flow-controlling units 5000*a* to 5000*d* and flows toward the corners $C_1$ to $C_4$ of the side wall section 1110 and the regions other than the corners $C_1$ to $C_4$. In other words, when the cleaning gas moves toward the corners $C_1$ to $C_4$ of the side wall section 1110 and regions other than the corners $C_1$ to $C_4$, the gas is distributed so that the rate of the amount of the gas flowing toward the corners $C_1$ to $C_4$ and the rate of the amount of the gas flowing toward regions other than the corners $C_1$ to $C_4$ are the same as or similar to each other or the difference therebetween become small.

Also, when the cleaning gas is sprayed via the spray unit 3000, the gas reacts with impurities deposited or adhering to the inner walls of the chamber 1000 and the substrate support 2100. The impurities are separated from the inner walls of the chamber 1000, the substrate support 2100, and the like by this reaction and are then discharged via the exhaust unit.

Here, as described above, the cleaning gas is evenly distributed by the plurality of gas flow-controlling units 5000*a* to 5000*d* and flows toward the corners $C_1$ to $C_4$ of the side wall section 1110 and the regions other than the corners $C_1$ to $C_4$. Accordingly, it is possible to prevent a cleaning defect from occurring due to insufficient cleaning gas. That is, it is possible to prevent a cleaning defect in which the corners $C_1$ to $C_4$ in the side wall section 1100 of the chamber 1000 are not sufficiently cleaned, or the regions other than corners $C_1$ to $C_4$, that is, the central regions $A_{C1}$, $A_{C2}$, $A_{C3}$, and $A_{C4}$ in the first to fourth side walls 1111*a* to 1111*d* are not sufficiently cleaned. In other words, the cleaning gas is allowed to reach the corners $C_1$ to $C_4$ or the regions other than the corners $C_1$ to $C_4$ in the side wall section 1110 of the chamber 1000. Accordingly, it is possible to easily clean impurities attached to the corners $C_1$ to $C_4$ and the regions other than corners $C_1$ to $C_4$.

INDUSTRIAL APPLICABILITY

According to the embodiments of the present disclosure, it is possible to prevent the gas from flowing unevenly to the corners or regions other than the corners within the chamber. That is, it is possible to evenly distribute the gas in the circumferential direction of the chamber. Accordingly, it is possible to prevent the cleaning defect from occurring at the corners of the chamber and in regions other than the corners.

What is claimed is:

1. A substrate processing apparatus comprising:

a chamber;

a substrate support positioned inside the chamber and configured to support a substrate;

an edge frame having a groove in a lower surface thereof, disposed above the substrate support and extending outward from an edge of the substrate support; and a gas flow-controlling unit which comprises an insertion member protruding upward to be inserted into the groove and is installed on a side wall of the chamber to be positioned between the side wall of the chamber and a side surface of the substrate support along a periphery of the substrate support, wherein the gas flow-controlling unit comprises a flow path which is provided in a region overlapping the edge frame.

2. The substrate processing apparatus of claim 1, wherein the gas flow-controlling unit comprises:

a body connected to the side wall; and a protrusion member protruding upward from the body to face the edge frame, wherein the insertion member is disposed to protrude upward from the body, the flow path is provided in the body to face the edge frame.

3. The substrate processing apparatus of claim 2, wherein the protrusion member is provided at an edge of the body to be positioned on the opposite side from the side wall.

4. The substrate processing apparatus of claim 2, wherein the protrusion member is provided in plurality, the plurality of protrusion members are arranged in a width direction of the side wall and spaced apart from each other, and the flow path is a space between the plurality of protrusion members.

5. The substrate processing apparatus of claim 2, wherein the protrusion member extends in a width direction of the side wall, and the flow path is provided behind the protrusion member to face the edge frame and passes through the body in an up-down direction.

6. The substrate processing apparatus of claim 5, wherein the flow path extends in the width direction of the side wall.

7. The substrate processing apparatus of claim 5, wherein the flow path is provided in plurality, and the plurality of flow paths are arranged in an extension direction of the protrusion member and spaced apart from each other.

8. The substrate processing apparatus of claim 1, wherein the gas flow-controlling unit is installed in a central region other than an edge of the side wall in the width direction.

9. A method for cleaning a substrate processing apparatus that comprises: a chamber; a substrate support positioned inside the chamber and configured to support a substrate; an edge frame having a groove in a lower surface thereof, disposed above the substrate support and extending outward from an edge of the substrate support; and a gas flow-controlling unit which comprises an insertion member protruding upward to be inserted into the groove and is installed on a side wall of the chamber to support the edge frame from below, the method comprising:

lowering the substrate support to rest the edge frame on the gas flow-controlling unit;

spraying a cleaning gas into the chamber; and allowing the cleaning gas to pass through a flow path which is provided in the gas flow-controlling unit to be positioned in a region that overlaps the edge frame.

10. A method for cleaning a substrate processing apparatus that comprises: a chamber; a gas spraying unit installed in the chamber; a substrate support installed inside the chamber to support a substrate at a position facing the gas spraying unit; an edge frame having a groove in a lower surface thereof and extending outward from an edge of the substrate support; and a gas flow-controlling unit which comprises an insertion member protruding upward to be inserted into the groove and is installed on a side wall of the chamber to be positioned between the side wall of the chamber and a side surface of the substrate support along a periphery of the substrate support, the method comprising:

withdrawing, out of the chamber, the substrate supported on the substrate support;

spraying a cleaning gas into the chamber by using the gas spraying unit; and allowing the cleaning gas to be discharged through a flow path which is provided in the gas flow-controlling unit to be positioned in a region that overlaps the edge frame.

* * * * *